(12) United States Patent
Byun et al.

(10) Patent No.: US 11,220,989 B2
(45) Date of Patent: Jan. 11, 2022

(54) METHOD OF CONTROLLING ENGINE RESTART OF VEHICLE

(71) Applicants: HYUNDAI MOTOR COMPANY, Seoul (KR); Kia Motors Corporation, Seoul (KR)

(72) Inventors: Jung-Sup Byun, Seongnam-si (KR); Seung-Woo Lee, Seoul (KR); Chan-Hee Won, Seoul (KR); Seong-Kyu Park, Hwaseong-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 184 days.

(21) Appl. No.: 16/702,241

(22) Filed: Dec. 3, 2019

(65) Prior Publication Data
US 2021/0003107 A1 Jan. 7, 2021

(30) Foreign Application Priority Data
Jul. 1, 2019 (KR) .................. 10-2019-0078905

(51) Int. Cl.
*F02N 11/08* (2006.01)
*F02N 11/04* (2006.01)
(Continued)

(52) U.S. Cl.
CPC ........ *F02N 11/0818* (2013.01); *F02D 41/065* (2013.01); *F02D 41/3005* (2013.01); *F02N 11/04* (2013.01); *F02N 11/0862* (2013.01); *B60K 6/26* (2013.01); *B60K 2006/268* (2013.01); *B60Y 2200/92* (2013.01); *F02D 2200/101* (2013.01); *F02N 2200/022* (2013.01); *F02N 2200/061* (2013.01); *G01R 31/382* (2019.01)

(58) Field of Classification Search
CPC .... B60K 2006/268; B60K 6/26; B60K 6/442; B60K 6/48; B60K 6/485; B60K 6/52; B60W 20/40; B60W 2510/0638; B60W 30/182; B60Y 2200/92; F02D 2041/227; F02D 2200/101; F02D 41/062; F02D 41/065; F02D 41/3005; F02N 11/006; F02N 11/04; F02N 11/0818; F02N 11/0848; F02N 11/0862; F02N 2200/022; F02N 2200/061; F02N 2200/0801; F02N 2300/2002; F02N 5/04; G01R 31/382
See application file for complete search history.

(56) References Cited

U.S. PATENT DOCUMENTS

2011/0040432 A1* 2/2011 Kaltenbach ............ B60K 6/365
    701/22
2011/0172900 A1* 7/2011 Mukaihara .......... F02N 11/0855
    701/112

(Continued)

*Primary Examiner* — Carl C Staubach
(74) *Attorney, Agent, or Firm* — Morgan, Lewis & Bockius LLP

(57) ABSTRACT

A method of controlling engine restart may include selecting, by a start controller, a first start situation and a second start situation for restarting an engine; determining a current possible start-up through the first and second start situations; prioritizing possible start-ups; and attempting to restart the engine by setting the first and second start situations as first start control and second start control, respectively, based on the priorities of the start-ups.

17 Claims, 15 Drawing Sheets

(51) Int. Cl.
  *F02D 41/06*   (2006.01)
  *F02D 41/30*   (2006.01)
  *G01R 31/382*   (2019.01)
  *B60K 6/26*   (2007.10)

(56) References Cited

U.S. PATENT DOCUMENTS

| | | |
|---|---|---|
| 2013/0131948 A1 | 5/2013 | Iwao et al. |
| 2015/0096518 A1* | 4/2015 | Creviston ........... F02N 11/0844 123/179.4 |
| 2015/0226171 A1* | 8/2015 | Kees ................... B60W 30/194 290/31 |
| 2016/0052511 A1* | 2/2016 | Takeuchi ................. B60K 6/48 701/22 |

* cited by examiner

METHOD OF CONTROLLING ENGINE RESTART OF VEHICLE

CROSS-REFERENCE TO RELATED APPLICATION

This application claims priority to Korean Patent Application No. 10-2019-0078905, filed on Jul. 1, 2019, which is incorporated herein by reference in its entirety.

BACKGROUND

Field

The present disclosure relates to engine restart control; and, particularly, to a vehicle using engine restart control, capable of further enhancing a contribution to an improvement in fuel efficiency and merchantable quality by prioritizing various start-ups.

Description of Related Art

In general, restart control of an engine while a vehicle is traveling allows the engine to be switched on and off (hereinafter, referred to as "engine ON/OFF switching") depending on various driving and road conditions that do not require the power of the engine.

In particular, the restart control significantly contributes to an improvement in fuel efficiency of the vehicle by safely performing the engine ON/OFF switching based on the logic procedure of a controller without using a key in the state in which the engine is operated after a key start.

The disclosure of this section is to provide background information relating to the invention. Applicant does not admit that any information contained in this section constitutes prior art.

SUMMARY

An embodiment of the present disclosure is directed to a method of controlling engine restart, capable of improving fuel efficiency and merchantable quality by prioritizing an inertial start, an MHSG start, a starter start, and an injection start to ensure stability of ISG and SSC starts, and particularly of significantly reducing a start failure situation by prioritizing start-ups to complement an initial start failure with a backup start, and a vehicle using the same.

Other aspects and advantages of the present disclosure can be understood by the following description, and become apparent with reference to the embodiments of the present disclosure. Also, it is obvious to those skilled in the art to which the present disclosure pertains that the aspects and advantages of the present disclosure can be realized by the means as claimed and combinations thereof.

In accordance with an embodiment of the present disclosure, there is provided a method of controlling engine restart, which includes selecting, by a start controller, a first start situation and a second start situation for restarting an engine, determining a current possible start-up by setting the first and second start situations as first and second start-ups, respectively, prioritizing the first and second start-ups, and attempting to restart the engine by setting the first and second start-ups as first start control and second start control, respectively, based on the priorities of the start-ups.

The restart may include an inertial start, an MHSG start, a starter start, and an injection start. The inertial start, the starter start, and the MHSG start may are applied to the first start control. The injection start, the starter start, and the MHSG start may be applied to the second start control.

The first start control and the second start control may be selected by start situation determination control, and the start situation determination control may include a first restart situation for the first start control and a second restart situation for the second start control by an engine speed when there is no key start request.

The engine speed may be a revolution per minute (RPM) of the engine, and the first and second restart situations may be determined by setting the RPM to 0 (zero).

The first start control may sequentially perform start-up check, start-up determination, start prioritization, and priority start attempt for each of an inertial start, a starter start, and an MHSG start.

The inertial start may apply detection of a transmission bit signal and non-detection of an engine reverse rotation signal to the start-up determination, the MHSG start may apply detection of a dischargeable battery state of charge (SOC) to the start-up determination, the starter start may apply detection of operation of a starter relay to the start-up determination, and the battery SOC may be larger than an SOC threshold.

The MHSG start may apply detection of motor-drivable MHSG available torque to the start-up determination, and the MHSG available torque may be larger than an available torque threshold.

The prioritization may apply one of a first inertial start having a high priority and a second inertial start having a next priority for the inertial start to the priority start attempt. The first inertial start may make it a condition that a vehicle speed is larger than a vehicle speed threshold and an accelerator pedal scope (APS) is smaller than an APS threshold, and the second inertial start may make it a condition that a vehicle speed is smaller than a vehicle speed threshold and an APS is larger than an APS threshold.

The first inertial start may perform the priority start attempt in the order of Priority #1=inertial start, Priority #2=MHSG start, and Priority #3=starter start, and then perform first backup start determination. The second inertial start may perform the priority start attempt in the order of Priority #4=MHSG start and Priority #5=starter start, and then perform first backup start determination.

In the first backup start determination, a start success may be checked as a timer setting value for a start failure of a first priority start priority of start priorities applied to the first or second inertial start, a backup start for start success may be set as a second priority start priority of the start priorities applied to the first or second inertial start when the timer setting value is exceeded, and the start attempt may be stopped when the backup start fails.

The second start control may sequentially perform start-up check, start-up determination, start prioritization, and priority start attempt for each of an MHSG start, a starter start, and an injection start.

The MHSG start may apply detection of a dischargeable battery state of charge (SOC) to the start-up determination, the starter start may apply detection of operation of a starter relay to the start-up determination, the injection start may apply detection of an engine revolution per minute (RPM) range to the start-up determination, the battery SOC may be larger than an SOC threshold, and the injection start may be when the RPM range is larger than an RPM threshold.

The MHSG start may apply detection of motor-drivable MHSG available torque to the start-up determination, and the MHSG available torque may be larger than an available torque threshold.

The prioritization may set an RPM range as a high idle, a low idle, and an engine stop to apply one of a first start priority, a second start priority, and a third start priority to the priority start attempt. The first, second, and third start priorities may be conditioned on the high idle, the low idle, and the engine stop, respectively.

The first start priority may perform the priority start attempt in the order of Priority #1=injection start, Priority #2=MHSG start, and Priority #3=starter start, and then perform second backup start determination. The second start priority may perform the priority start attempt in the order of Priority #4=MHSG start and Priority #5=starter start, and then perform second backup start determination. The third start priority may perform the priority start attempt in the order of Priority #6=MHSG start and Priority #7=starter start, and then perform second backup start determination.

In the second backup start determination, a start success may be checked as a timer setting value for a start failure of a first priority start priority of start priorities applied to the first, second, or third start priority, a backup start for start success may be set as a second priority start priority of the start priorities applied to the first, second, or third start priority when the timer setting value is exceeded, a start success may be checked as a backup timer setting value for a start failure of the backup start, a final backup start may be set as a third priority start priority of the start priorities applied to the first, second, or third start priority when the backup timer setting value is exceeded, a start success may be checked as a final backup timer setting value for a start failure of the final backup start, and the start attempt may be stopped when the final backup start fails.

In accordance with another embodiment of the present disclosure, there is provided a method of controlling engine restart, wherein a start controller selects one of ISG/SSC start control applied as first start control for restarting an engine and CoM start control applied as second start control for an inertial start, an MHSG start, a starter start, and injection start, the ISG/SSC start control includes a priority for the restart including a high priority setting the inertial start as a transmission inertial start possibility state and next priorities setting the starter start and the MHSG start as a transmission inertial start impossibility state, and the CoM start control includes a priority for the restart including a high priority setting the injection start as an engine speed fuel injection possibility state, a next priority setting the starter start and the MHSG start as an engine speed fuel injection impossibility state, and a low priority setting the starter start and the MHSG start as an engine speed non-detection state.

In the ISG/SSC backup control of the ISG/SCC start control, for one of Priority #1=injection start, Priority #2=MHSG start, Priority #3=starter start, Priority #4=MHSG start, and Priority #5=starter start, two start successes may be checked as a timer setting value, and the control may switch to start impossibility when the timer setting value is exceeded so that the start attempt is stopped. The two start successes may be checked by first and second times, and the timer setting value may be applied to each of the first and second times.

In the CoM backup control of the CoM start control, for one of Priority #1=injection start, Priority #2=MHSG start, Priority #3=starter start, Priority #4=MHSG start, Priority #5=starter start, Priority #6=MHSG start, and Priority #7=starter start, three start successes may be checked as a timer setting value, and the control may switch to start impossibility when the timer setting value is exceeded so that the start attempt is stopped. The three start successes may be checked by first, second, and third times, and the timer setting value may be applied to each of the first, second, and third times.

In accordance with a further embodiment of the present disclosure, there is provided a vehicle that includes a start controller configured to perform ISG/SSC start control, in which an inertial start is set as a high priority and a starter start and an MHSG start are set as next priorities with a possibility of transmission inertial start for restart attempt, and CoM start control, in which an injection start is set as a high priority and an MHSG start and a starter start are set as a next priority and a low priority in an engine speed detection range, and to complement a restart failure of the ISG/SSC start control or the CoM start control with backup start control, and a 48V MHSG system including a starter to restart an engine having an injector for injection of fuel, and an MHSG.

The start controller may be connected to an engine ECU for controlling the engine, an MCU for controlling the MHSG, a TCU for controlling a transmission, a BMS for controlling a battery, through a CAN for communication therebetween.

DESCRIPTION OF EMBODIMENTS

Figure 1:
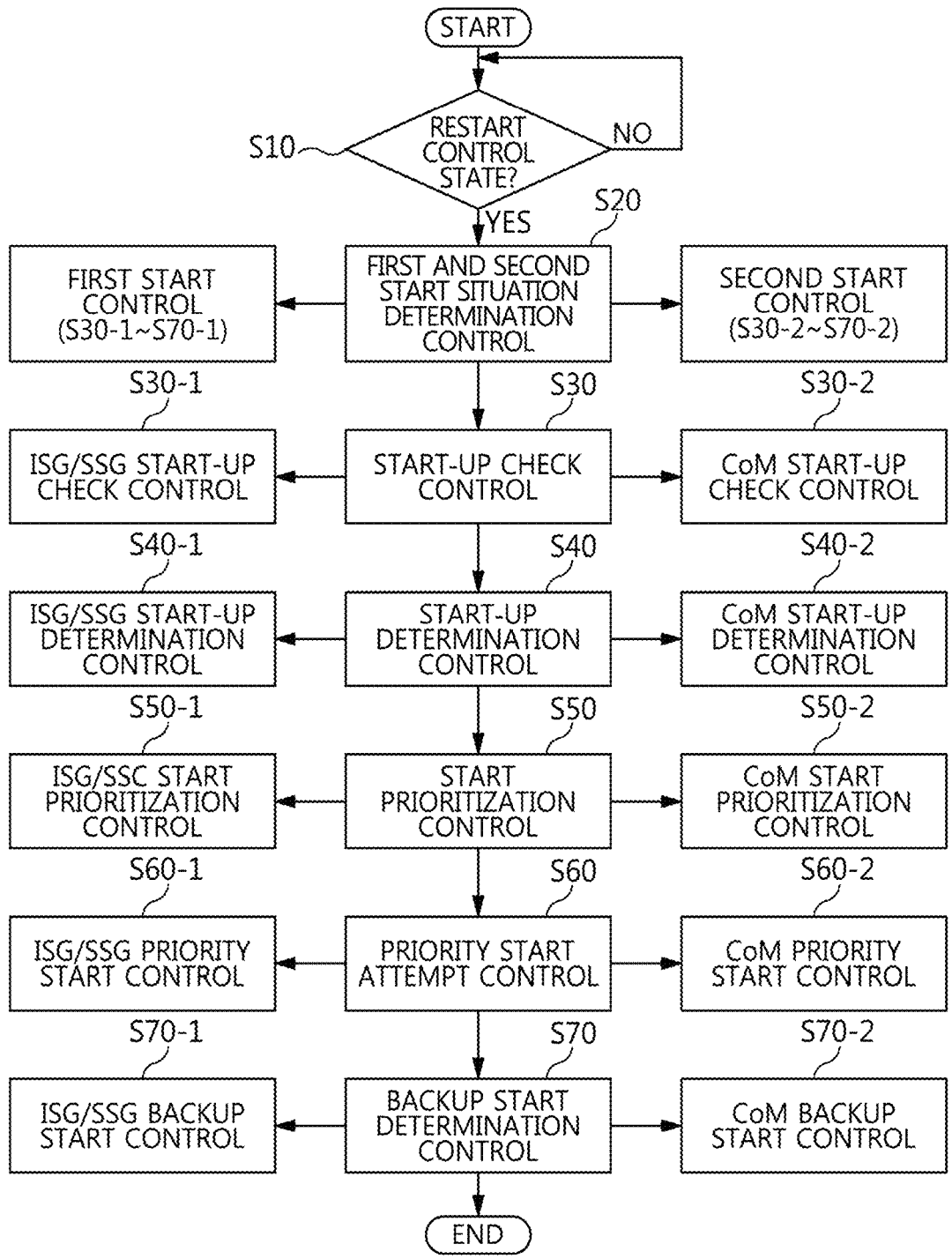
FIG. 1 is a flowchart illustrating an engine restart control method according to the present disclosure.

Embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

The engine restart control significantly contributes to an improvement in fuel efficiency of the vehicle by safely performing the engine ON/OFF switching depending on the logic procedure of a controller without using a key in the state in which the engine is operated after a key start. In some implementations of engine start, the key start may be either a starter start in which a starter motor's torque is transferred to a crankshaft to start an engine, for example, a starter start used in a typical vehicle, or a mild hybrid starter & generator (MHSG) start of a 48V vehicle that transmits motor torque, which enables a high engine RPM compared to the starter torque, to a crankshaft.

Specifically, examples of the restart control include an idle stop and go (ISG) start, a start/stop coasting (SSC) start, an inertial start, and an injection (e.g., fuel injection) start. For example, the ISG start refers to engine ON/OFF switching that reflects a vehicle stop situation due to road congestion, the SSC start refers to engine ON/OFF switching that reflects coasting on the downhill road, the inertial start refers to engine ON/OFF switching that reflects the traveling inertia of the vehicle by shift clutch/damper control, and the injection start refers to engine ON/OFF switching that reflects the fuel injection resumption of an injector.

Particularly, the ISG start maintains the engine OFF (i.e., ISG STOP) when the vehicle is stopped due to the road congestion and switches to the engine ON (i.e., ISG GO) through operation of the accelerator pedal by the driver, thereby preventing fuel consumption due to engine idling (i.e., idle). In this case, switching to the engine ON enters ISG GO by the starter start. The SSC start performs the engine ON/OFF switching depending on whether the accelerator pedal is operated during the coasting in which the fuel cut of the engine and the clutch OFF of the transmission are performed, thereby preventing or minimizing the fuel consumption by the reduction in engine power.

As described above, the restart control is advantageous in that it can be utilized to control the start of the engine in the vehicle to improve fuel efficiency. In particular, the restart control is advantageous in that it can be more suitably utilized for the 48V vehicle adopting a 48V mild hybrid starter & generator (MHSG) system including an MHSG, which is a motor combined with a starter and a generator, a 48V battery, a low voltage DC/DC converter (LDC), and a starter.

However, in the above implementation, the logic of the restart control does not reflect different start situations to various start-ups, and it may be therefore necessary to improve the logic.

For example, the necessity for the logic improvement of the restart control involves firstly checking a possible start-up in each start situation, secondly determining each start situation by minutely sorting ISG and SSC situations, thirdly prioritizing the ISG and SSC starts (i.e., restart), fourthly prioritizing starts in the change of mind (CoM) situation reflecting an immediate driver start request, and fifthly performing a backup restart in the start failure situation.

Accordingly, the ISG start associated with the change of mind (CoM) situation may be performed only by the starter, but the restart through ISG implementation may not be performed by waiting for the time at which the engine RPM is reduced to 0 (zero) to protect the components of the starter.

In addition, in the SSC start associated with the change of mind (CoM) situation, the restart through SSC implementation may not be performed due to the SSC situation causing poor startability. Referring to FIG. 1, in embodiments, an engine restart control method includes first and second start situation determination S20 in a restart control state S10 and then prioritizes an inertial start, an MHSG start, a starter start, and an injection start in the state in which the restart involves first start control S30-1 to S70-1 and second start control S30-2 to S70-2 so that start control logic may be optimized using the most appropriate start-up for a restart request. In this case, the first start control S30-1 to S70-1 may be ISG/SSC start control, and the second start control S30-2 to S70-2 may be applied as CoM start control or vice versa.

Particularly, the start control logic includes start situation determination control S20, start-up check control S30, start-up determination control S40, start prioritization control S50, priority start attempt control S60, and backup start determination control S70. The start control logic is established as optimal start control logic through the logic for each of the control steps.

The optimal start control logic is performed in the restart control state S10 in such a manner that the start situation determination control S20 determines ISG/SSC start control and CoM start control, and the start-up check control S30 and the start-up determination control S40 determine one of the inertial start, the MHSG start, the starter start, and the injection start applied to each of the ISG/SSC start control and the CoM start control.

In addition, the start prioritization control S50 and the priority start attempt control S60 perform an initial start of a high priority of the inertial start, the MHSG start, the starter start, and the injection start, and the backup start determination control S70 performs a next start of a next priority or a next priority and a low priority, thereby compensating for a restart failure.

As a result, the engine restart control method can improve merchantable quality by optimally controlling the most appropriate start-up, can improve fuel efficiency by reducing an amount of fuel with the MHSG motor start capable of avoiding a delay of fuel injection point compared to using the starter and of avoiding an excessive injection amount of fuel consumed in the general start, can improve power performance and reduce consumer complaints by immediately performing the restart in the change of mind (CoM) situation, and can protect parts and reduce a possibility of restart failure through the backup start function using the high priority and the next priority.

Figure 2:
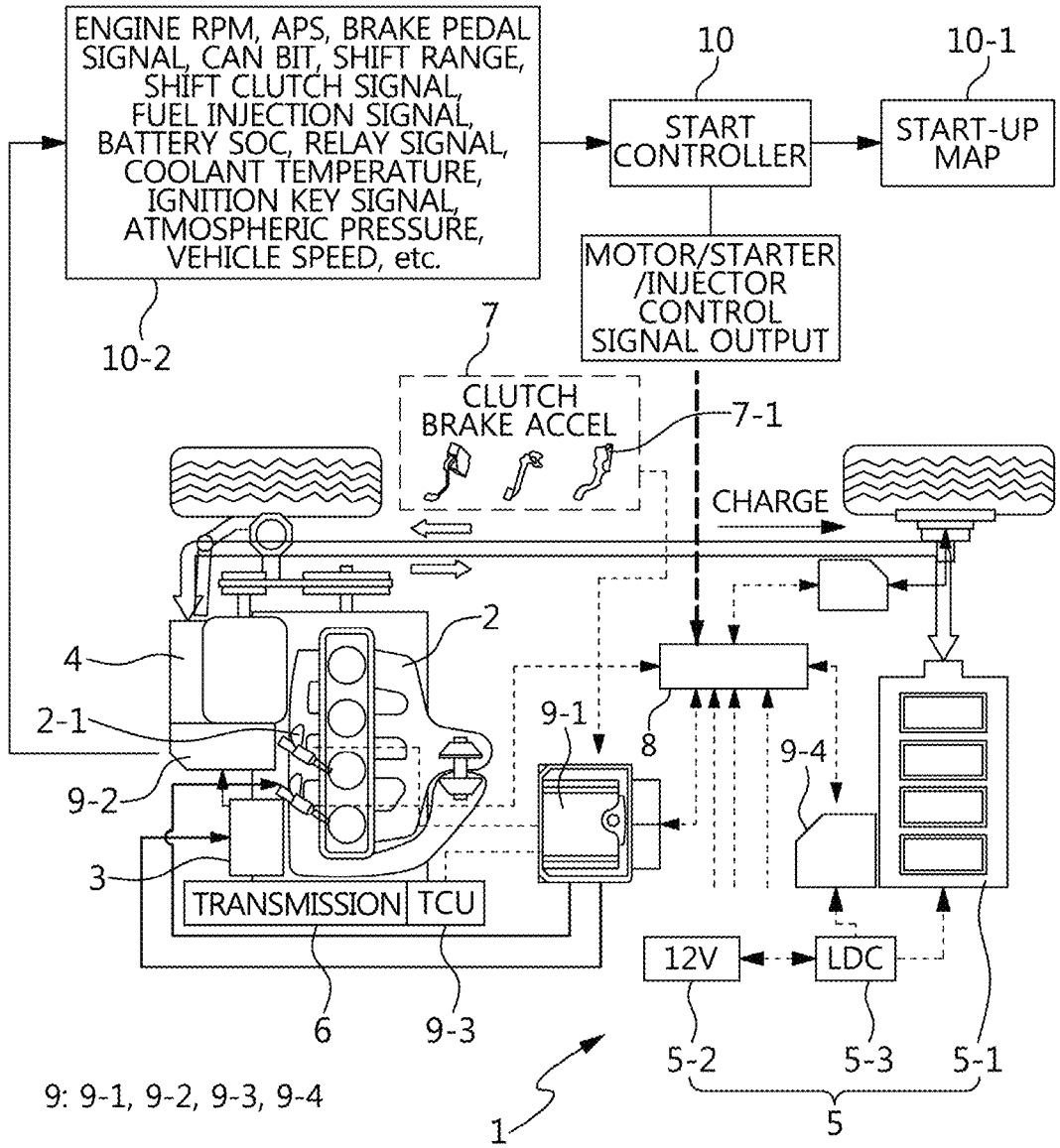
FIG. 2 is an example of a vehicle using engine restart control according to the present disclosure.

Referring to FIG. 2, a vehicle 1 includes an engine 2, a starter 3, a mild hybrid starter & generator (MHSG) 4, a battery 5, a transmission 6, a pedal 7, a controller area network (CAN) 8, a vehicle controller 9, and a start controller 10. Therefore, the vehicle 1 is a 48V vehicle with the MHSG 4 as a 48V MHSG system and the 48V vehicle is typically a mild hybrid electric vehicle.

The engine 2 is a multi-cylinder engine having cylinders in which fuel is injected from an injector 2-1, and is either a gasoline engine or a diesel engine.

The starter 3, the MHSG 4, and the battery 5 constitute the 48V MHSG system. The starter 11 is connected to a crankshaft of the engine 2, similar to an existing starter, to perform a key start request. The MHSG 4 is connected to the starter 3 to perform a key start request and includes a motor and an inverter connected to the crankshaft of the engine 2 by a belt on the opposite side of the starter 3. The battery 5 includes a high-voltage 48V battery 5-1, a low-voltage 12V battery 5-2, and a low-Voltage DC/DC converter (LDC) 5-3 for performing 12V voltage conversion to drive the motor of the MHSG 4.

The transmission 6 is connected to the engine 2 by an engine clutch, and outputs engine power as torque based on the shift range. The pedal 7 includes an accelerator pedal 7-1 for accelerating the vehicle 1, a clutch pedal for controlling the engine clutch, and a brake pedal for braking the vehicle 1.

The CAN 8 is a vehicle communication network that interconnects the vehicle controller 9 and the start controller 10 to generate communication bits (0, 1) together with mutual information and data transmission and reception.

The vehicle controller 9 includes an engine electronic control unit (ECU) 9-1, a motor control unit (MCU) 9-2, a transmission control unit (TCU) 9-3, and a battery management system (BMS) (9-4). The engine ECU 9-1 controls the engine 2 and transmits engine-related information to a data processor 10-2.

The MCU 9-2 is connected to the start controller 10 and controls the MHSG 13 to perform a key start based on the MHSG start logic or the starter/MHSG start logic. The TCU 9-3 is connected to the engine ECU 9-1 and controls the shift range of the transmission 6 based on the operating state of the vehicle 1.

The BMS 9-4 measures a battery cell temperature, a battery coolant temperature, and an ambient temperature (e.g., atmospheric temperature) to control battery thermal management based on the temperature condition, and transmits a battery SOC and voltage information of 48V and 12V to the data processor 10-2.

The start controller 10 includes a memory in which optimal start control logic is programmed and stored, for the restart state detection S10, the start situation determination S20, the start-up check S30, the start-up determination S40, the start prioritization S50, the priority start attempt S60, and the backup start determination S70.

To this end, the start controller 10 operates as a central processing unit connected to the memory, includes a start-up map 10-1 and the data processor 10-2 to read or calculate necessary information or data, and performs control signal output A for each of the motor, the starter, and the injector.

The start-up map 10-1 is matched with a 48V performance map connected to the BMS 9-4 for controlling the battery 5 and determines whether the battery SOC is sufficiently maintained for matching with the 48V performance map to transmit it to the start controller 10.

The data processor 10-2 transmits the engine speed (e.g., revolution per minute (RPM)) of the engine 2, the motor speed (RPM), motor torque, and motor temperature of the MHSG 4, the accelerator pedal scope (APS) of the accelerator pedal 7-1, the brake pedal signal, the BIT signal between the systems of the CAN 8, the shift range and the shift clutch signal of the transmission 6, the fuel injection signal of the injector 2-1, the battery state of charge (SOC) of the 48V battery 5-1 and the 12V battery 5-2, the operation and the relay signal of the starter 3, the coolant temperature of the engine 2, the atmospheric pressure, the vehicle speed, etc., as input data, to the start controller 10.

Hereinafter, the engine restart control method of FIG. 1 will be described in detail with reference to FIGS. 2 to 16. In this case, the control subject is the start controller 10 that cooperates with the engine ECU 9-1, the MCU 9-2, the TCU 9-3, and the BMS 9-4, and the control target is the injector 2-1, the starter 3, and the MHSG 4. The first start control S30-1 to S70-1 refers to an engine restart based on the ISG/SCC, and the second start control S30-2 to S70-2 refers to an engine restart based on the CoM.

First, the start controller 10 enters the restart control state S10. The restart control state refers to an engine operating state by the key start of the vehicle 1 since it refers to the active state of the start controller 10.

Next, the start controller 10 sequentially performs the start situation determination control S20, the start-up check control S30, the start-up determination control S40, the start prioritization control S50, the priority start attempt control S60, and the backup start determination control S70 in the restart control state S10. The logic for each step of the control S20, S30, S40, S50, S60, and S70 includes the following contents.

Figure 3:
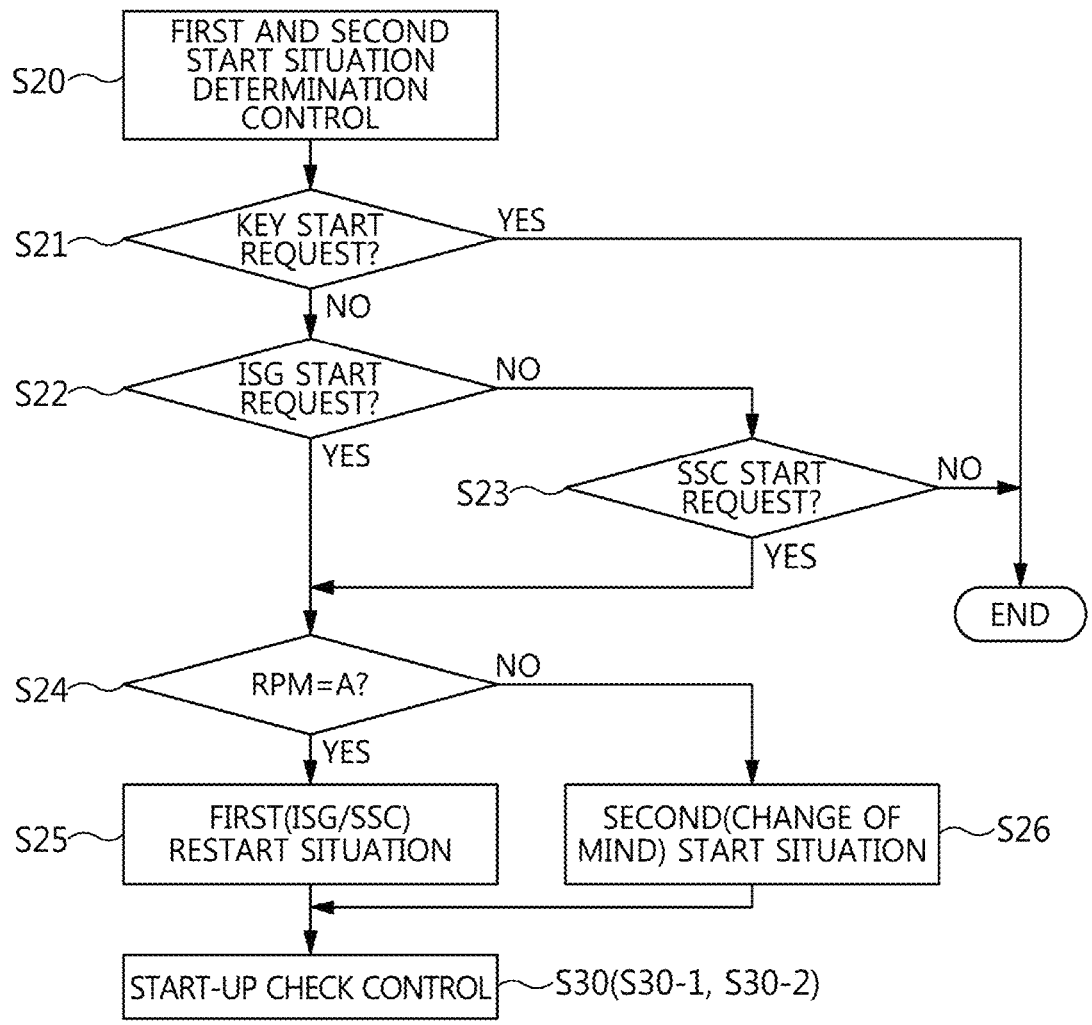
FIG. 3 is a detailed flowchart illustrating start situation determination control according to the present disclosure.

Referring to FIG. 3, the start controller 10 performs the start situation determination control S20 including a restart determination step S21 to S23, an engine strop determination step S24, a first (ISG/SCC) restart situation step S25, and a second (CoM) restart situation step S26. To this end, the start controller 10 receives the engine speed (RPM), the APS, the brake pedal signal, the CAN BIT, the shift range, the shift clutch signal, the fuel injection signal, the battery SOC, the relay signal, the coolant temperature, the atmospheric pressure, the vehicle speed, etc., as input data, from the data processor 10-2, and detect and check them.

The restart determination S21 to S23 includes a key start request check step S21, an ISG start request check step S22, and an SSC start request check step S23.

For example, the key start request check S21 restricts the restart condition to the ISG start situation and the SSC start situation excluding the engine start situation by the key. The ISG start request check S22 reflects a vehicle congestion situation encountered during road driving in the city by considering the ISG start of the ISG and SSC starts. The SSC start request check S23 reflects a coasting situation instead of the vehicle congestion situation.

The engine stop determination S24 sets the checked ISG start request S22 or the checked SSC start request S23 as a keyless start request, and determines whether the keyless start request is based on the ISG/SCC logic or based on the change of mind (Com) reflecting an immediate driver start request, and the following engine speed determination equation is applied to the determination:

Engine Speed Determination Equation: RPM=A.

Here, "RPM" is the engine speed detection value in the keyless start request, "A" is 0 (zero) as the engine speed threshold, and "=" is the inequality indicating the magnitude relationship between the two values.

As a result, the start controller 10 defines "RPM=0" as the first (ISG/SSC) restart situation S25, and defines "RPM>0" as the second (CoM) restart situation S26.

The start situation determination control S20 determines the restart situation of the engine 2 including the first (ISG/SSC) restart situation S25 and the second (CoM) restart situation S26.

Next, the start controller 10 enters the start-up check control S30.

Figure 4:
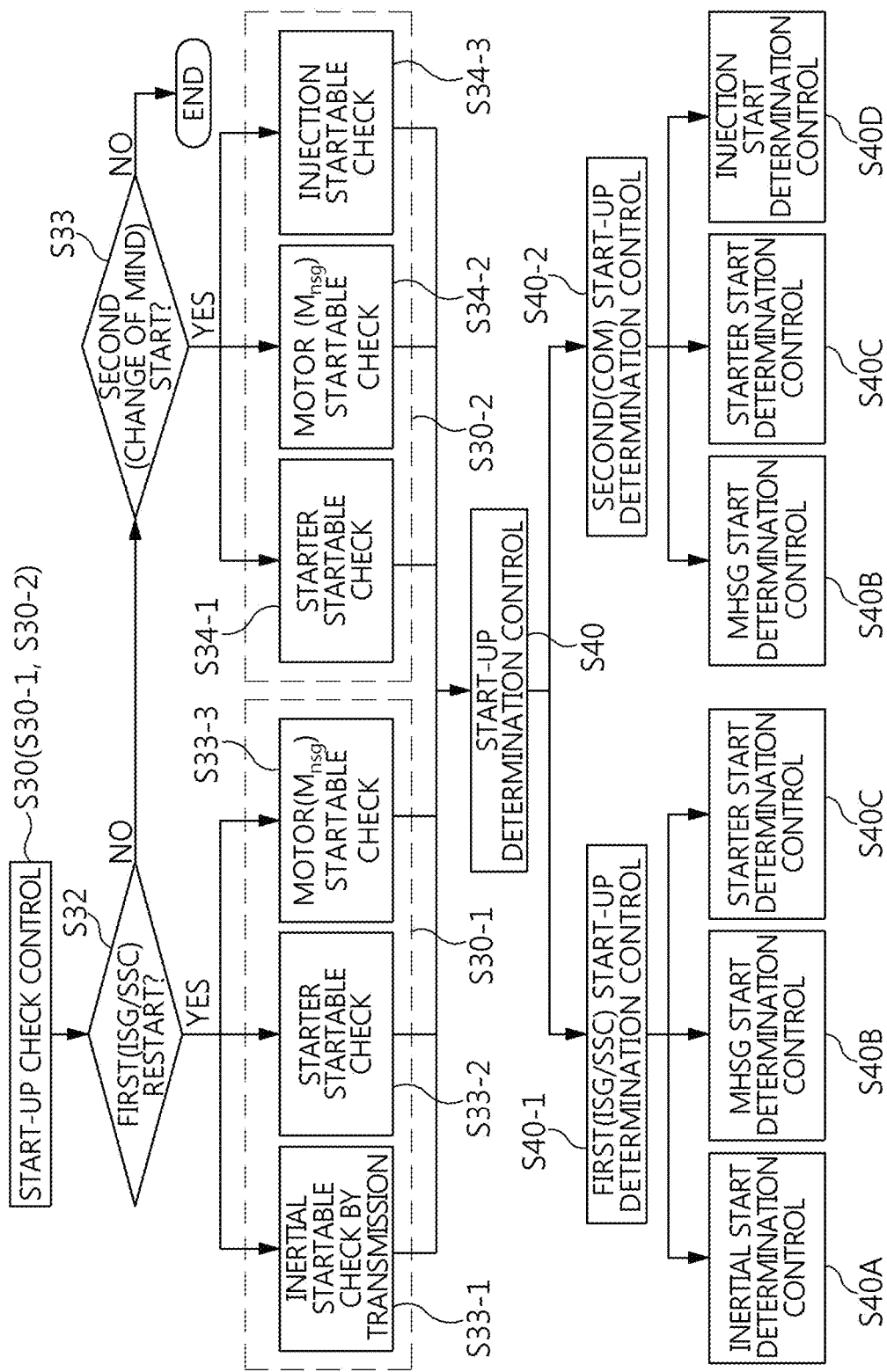
FIG. 4 is a detailed flowchart illustrating possible start-up check control according to the present disclosure.

Referring to FIG. 4, the start controller 10 performs the start-up check control S30 including an ISG/SSC start-up check control S33-1 and a CoM start-up check control S30-2 and then performs the start-up determination control S40 including ISG/SSC start-up determination control S40-1 and CoM start-up determination control S40-2.

To this end, as illustrated in FIG. 2, the start controller 10 cooperates with the start-up map 10-1, and applies an operating condition (i.e., existing logic), applied to implement the logic for each start-up, to a feasibility of the inertial start, the MHSG start, the starter start, and the injection start included in the start control logic.

The ISG/SCC start-up check control S33-1 of the start-up check control S30 is performed through inertial startable check by the transmission S33-1, starter startable check S33-2, and motor (MHSG) startable check S33-3 in the first (ISG/SSC) restart determination S32. The CoM start-up check control S30-2 of the start-up check control S30 is performed through starter startable check S34-1, motor (MHSG) startable check S34-2, and injection startable check S34-3 in the second (CoM) restart determination S33.

The ISG/SCC start-up determination control S40-1 of the start-up determination control S40 includes inertial start determination control S40A, MHSG start determination control S40B, and starter start determination control S40C. The CoM start-up determination control S40-2 of the start-up determination control S40 includes MHSG start determination control S40B, starter start determination control S40C, and injection start determination control S40D.

The ISG/SSC start-up check control S33-1 checks a current possible ISG/SCC start-up through the inertial start possibility by the transmission S33-1, the starter start possibility S33-2, and the motor (MHSG) start possibility S33-3. The CoM start-up check control checks a current possible CoM start-up through the starter start possibility S34-1, the motor (MHSG) start possibility S34-2, and the injection start possibility S34-3.

The ISG/SCC start-up determination control S40-1 determines a current possible ISG/SCC start-up by determining the inertial start possibility by the transmission through the inertial start determination control S40A, the motor (MHSG) start possibility through the MHSG start determination control S40B, and the starter start possibility through the starter start determination control S40C.

The CoM start-up determination control S40-2 determines a current possible CoM start-up by determining the motor (MHSG) start possibility through the MHSG start determination control S40B, the starter start possibility through the starter start determination control S40C, and the injection start possibility through the injection start determination control S40D.

Next, the start controller 10 enters the start-up determination control S40.

FIGS. 5 to 8 illustrate a detailed procedure based on each operating condition of the inertia start determination control S40A, the MHSG start determination control S40B, the starter start determination control S40C, and the injection start determination control S40D.

In this case, the inertial start determination control S40A, the MHSG start determination control S40B, and the starter start determination control S40C are applied to the ISG/SCC start-up determination control S40-1 of the start-up determination control S40. The MHSG start determination control S40B, the starter start determination control S40C, and the injection start determination control S40D are applied to the CoM start-up determination control S40-2 of the start-up determination control S40.

Figure 5:
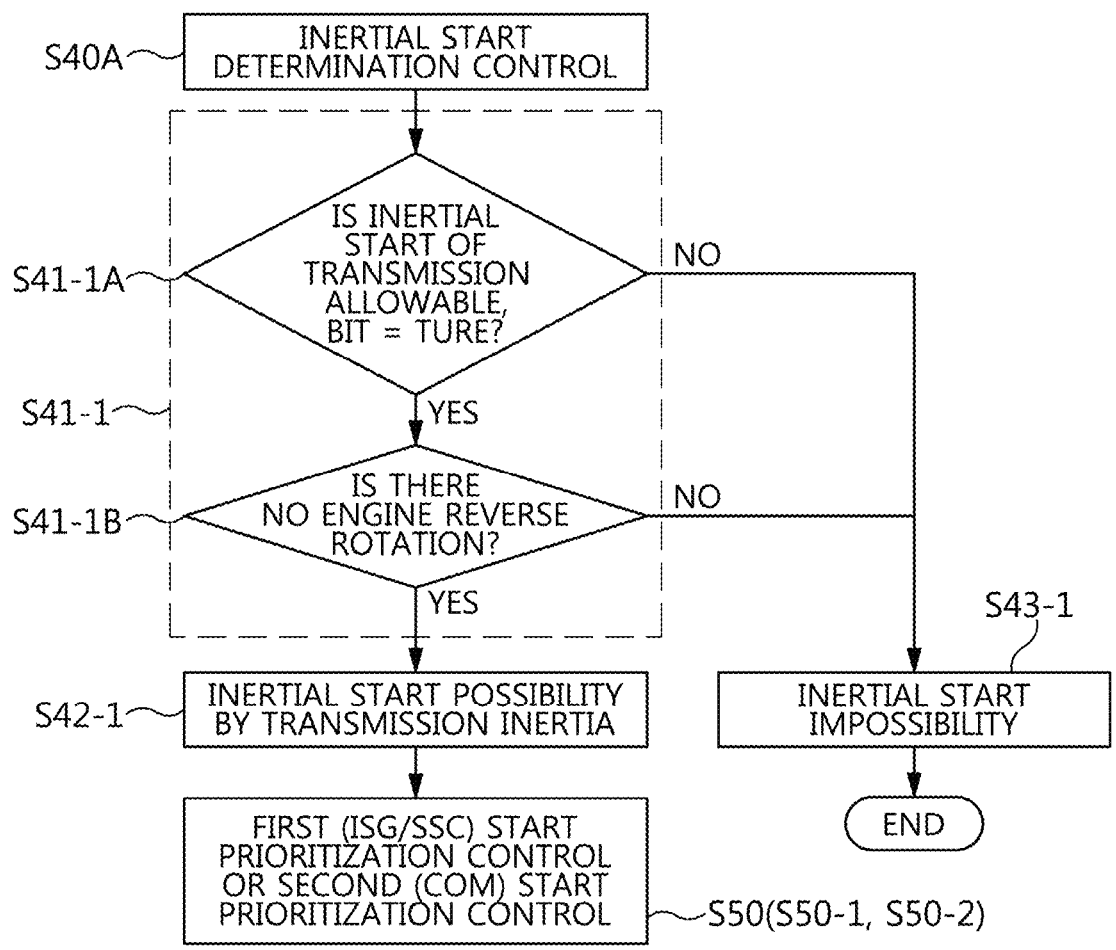
FIG. 5 is a detailed flowchart illustrating an inertial start in the start-up check control according to the present disclosure.

Referring to FIG. 5, the inertial start determination control S40A is performed in a vehicle condition check step S41-1, an inertial start possibility check step S42-1, an inertial start possibility non-check step S43-1. To this end, as illustrated in FIG. 2, the start controller 10 receives the engine speed (RPM), the CAN BIT, the shift range, the shift clutch signal, etc., as input data, from the data processor 10-2 and detects and checks them.

For example, the vehicle condition check S41-1 is performed in a transmission check step S41-1A and an engine check step S41-1B in the inertial startable state by the transmission 6. The transmission check S41-1A is performed so that the start controller 10 checks whether the bit signal of the TCU 9-3 is 1 or 0 (zero) through the CAN 8. In the transmission check S41-1A, Bit=1 is set as "Bit=True" which is an inertia start enable state by the transmission 6, whereas Bit=0 is set as "Bit=False" which is an inertial start disable state by the transmission 6.

Therefore, the engine check S41-1B is performed so that the start controller 10 checks whether the rotation signal of the engine ECU 9-1 is positive (+) or negative (−) through the CAN 8. When the positive (+) signal is checked from among the positive (+) signal defined as the forward rotation of the engine and the negative (−) signal defined as the reverse rotation of the engine, it is checked as an engine state that enables the inertia start of the transmission 6.

Accordingly, the inertial start possibility non-check S43-1 is excluded from the start-up determination control S40 since the condition of the transmission 6 and the engine 2 fails when the transmission 6 is not in the Bit=True state or the reverse rotation of the engine is detected in the case where the transmission 6 is in the Bit=True state. On the other hand, the inertial start possibility check S42-1 is applied to the inertial start-up of the start prioritization control S50 since the condition of the transmission 6 and the engine 2 is established when the transmission 6 is in the Bit=True state and the reverse rotation of the engine is not detected.

Subsequently, the start controller 10 performs the MHSG start determination control S40B.

Figure 6:
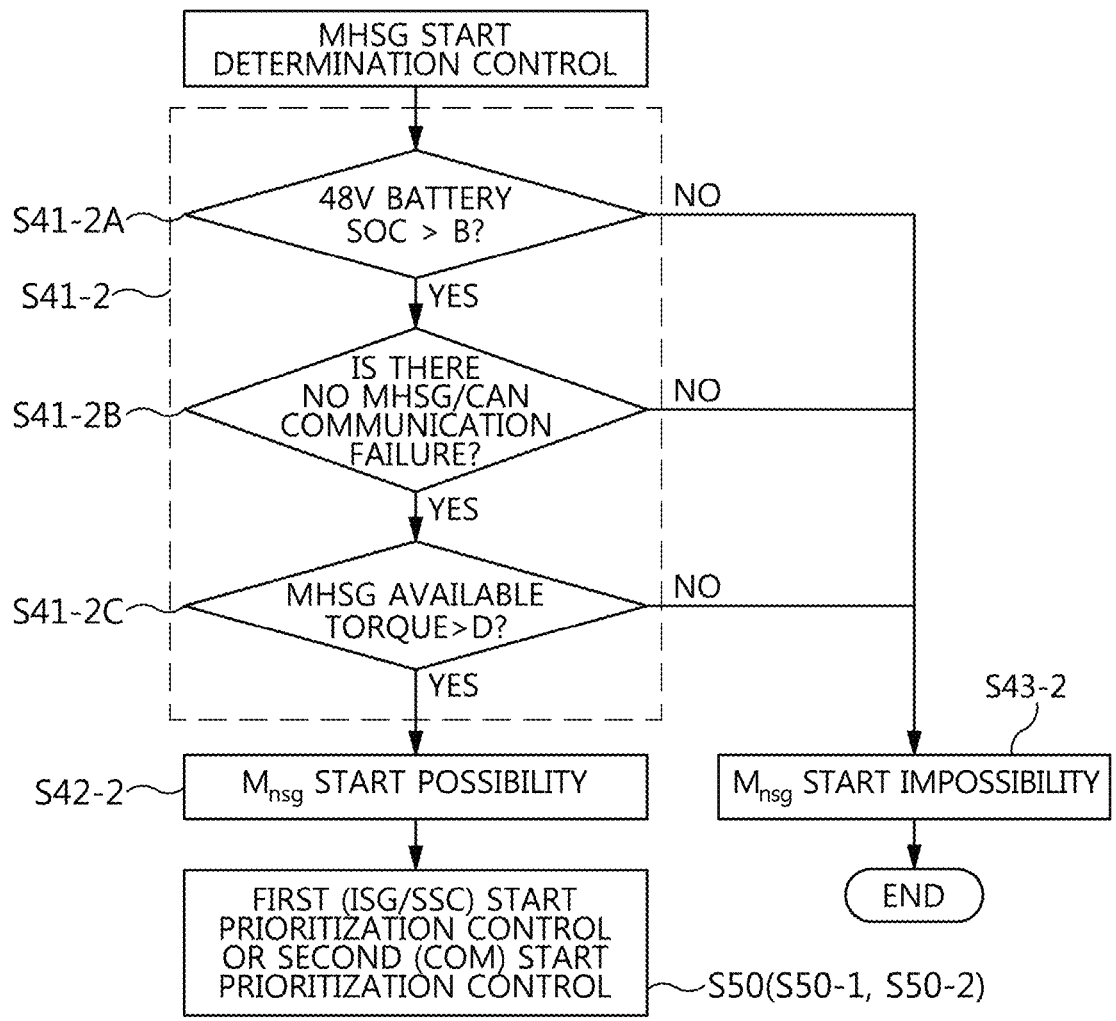
FIG. 6 is a detailed flowchart illustrating an MHSG start in the start-up check control according to the present disclosure.

Referring to FIG. 6, the MHSG start determination control S40B is performed in a vehicle condition check step S41-2, an MHSG start possibility check step S42-2, an MHSG start possibility non-check step S43-2. To this end, as illustrated in FIG. 2, the start controller 10 receives the battery SOC of the 48V battery, the motor speed (RPM) and motor torque of the MHSG, etc., as input data, from the data processor 10-2 and detects and checks them.

For example, the vehicle condition check S41-2 is performed in a battery check step S41-2A, an MHSG bit check step S41-2B, and an MHSG torque check step S41-2C in the MHSG startable state by the motor of MHSG 4. The battery check S41-2A is performed using the following battery determination equation. The MHSG bit check S41-2B sets "Bit=True" of the MHSG 4 and the CAN 8 as an MHSG startable state based on the communication of the MHSG 4 and the CAN 8. The MHSG torque check S41-2C is performed using the following MHSG determination equation:

Battery Determination Equation: 48V battery SOC>B; and

MHSG Determination Equation: MHSG available torque>D.

Here, "48V battery SOC" is the 48V battery SOC detection value of the 48V battery 5-1, "B" is the minimum dischargeable value as the 48V battery SOC threshold in which the start water temperature is applied to the coolant temperature of the engine 2, "MHSG available torque" is the motor available torque calculation value of the MHSG 4, "D" applies the minimum motor-drivable value as the motor torque threshold including the battery power (i.e., SOC) and the motor temperature of the MHSG 4.

Accordingly, the MHSG start possibility non-check S43-2 is excluded from the start-up determination control S40 since the condition of the MHSG 4 and the 48V battery 5-1 fails when any of "48V battery SOC>B" and "MHSG available torque>D" is not satisfied.

On the other hand, the MHSG start possibility check S42-2 is applied to the MHSG start-up of the start prioritization control S50 since the condition of the MHSG 4 and the 48V battery 5-1 is established when both of "48V battery SOC>B" and "MHSG available torque>D" are satisfied. In addition, "=" is the inequality indicating the magnitude relationship between the two values.

Next, the start controller 10 performs the starter start determination control S40C.

Figure 7:
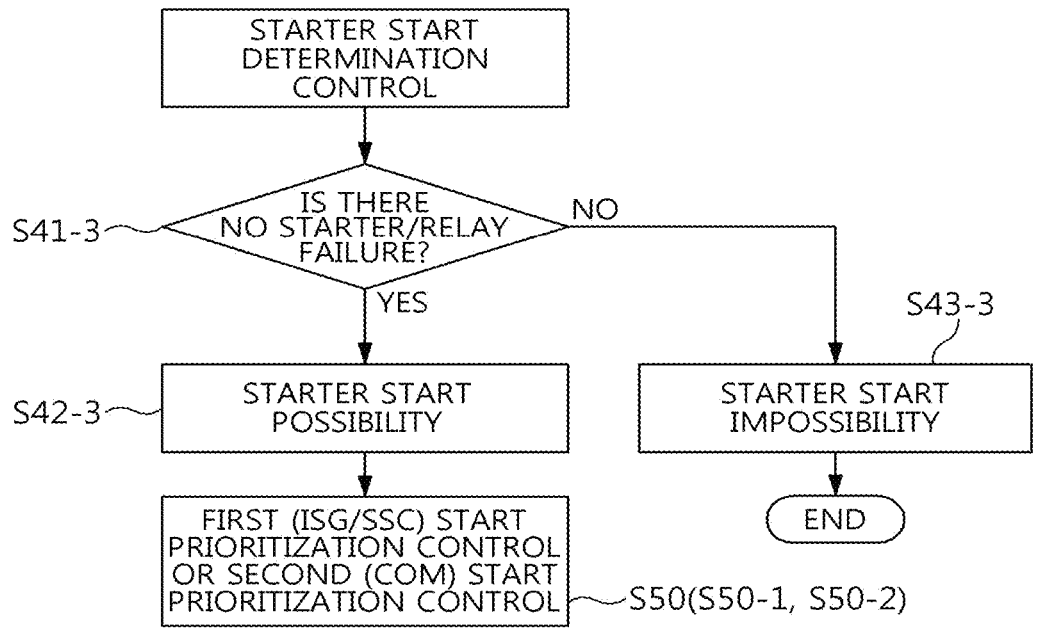
FIG. 7 is a detailed flowchart illustrating a starter start in the start-up check control according to the present disclosure.

Referring to FIG. 7, the starter start determination control S40C is performed in a vehicle condition check step S41-3, a starter start possibility check step S42-3, a starter start possibility non-check step S43-3. To this end, as illustrated in FIG. 2, the start controller 10 receives the operation and relay signal of the starter 3 as input data from the data processor 10-2 and detects and checks them.

For example, the vehicle condition check S41-3 checks whether the starter 3 and the starter relay fail in the starter startable state by the starter 3, and sets a fault signal non-detection state as the starter startable state by the starter 3.

Accordingly, the starter start possibility non-check S43-3 is excluded from the start-up determination control S40 since the condition of the starter 3 fails when the starter 3 and the starter relay are faulty. On the other hand, the starter start possibility check S42-3 is applied to the starter start-up of the start prioritization control S50 since the condition of the starter 3 is established when the starter 3 and the starter relay are normal.

Subsequently, the start controller 10 performs the injection start determination control S40D.

Figure 8:
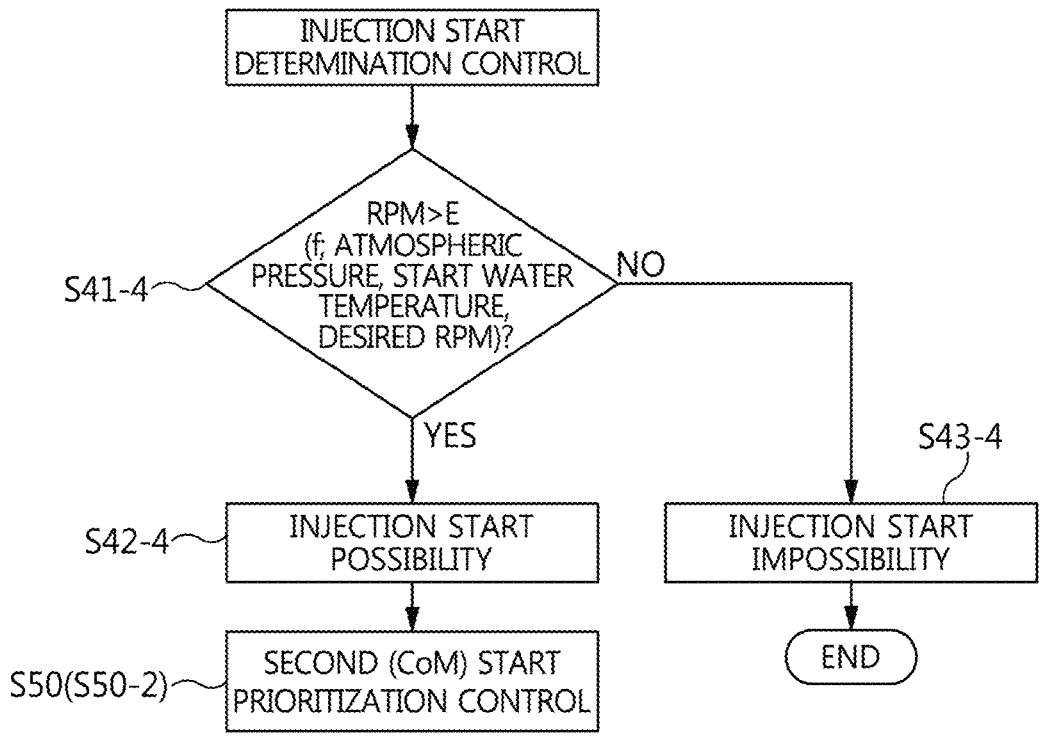
FIG. 8 is a detailed flowchart illustrating an injection start in the start-up check control according to the present disclosure.

Referring to FIG. 8, the injection start determination control S40D is performed in a vehicle condition check step S41-4, an injection start possibility check step S42-4, an injection start possibility non-check step S43-4. To this end, as illustrated in FIG. 2, the start controller 10 receives the engine speed, the coolant temperature, and the atmospheric pressure as input data from the data processor 10-2 and detects and checks them.

For example, the vehicle condition check S41-4 uses the following engine operation determination equation in the injection startable state by the fuel injection of the injector 2-1:

Engine Operation Determination Equation: RPM>E.

Here, "RPM" is the engine speed detection value in the injection start determination, "E" is the engine operation speed threshold and is determined as the RPM factor, the RPM factor being calculated in consideration of the start water temperature, which is the coolant temperature of the engine 2, the atmospheric pressure, and the desired RPM of the engine 2, and ">" is the inequality indicating the magnitude relationship between the two values.

Accordingly, the injection start possibility non-check S43-4 is excluded from the start-up determination control S40 since the condition of the engine 2 fails when "RPM>E" is not satisfied. On the other hand, the injection start possibility check S42-4 is applied to the MHSG start-up of the start prioritization control S50 since the condition of the MHSG 4 and the 48V battery 5-1 is established when all of "48V battery SOC>B", "Bit=True", and "MHSG available torque>D" are satisfied.

The start controller 10 performs the inertial start determination control S40A, the MHSG start determination control S40B, the starter start determination control S40C, and the injection start determination control S40D, and performs the ISG/SSC start-up determination control S40-1 and the CoM start-up determination control S40-2 as a result of the start-up determination control S40.

Next, the start controller 10 enters the start prioritization control S50. In this case, the start prioritization control S50 includes ISG/SSC start prioritization control S50-1 and the CoM start prioritization control S50-2.

Figure 9:
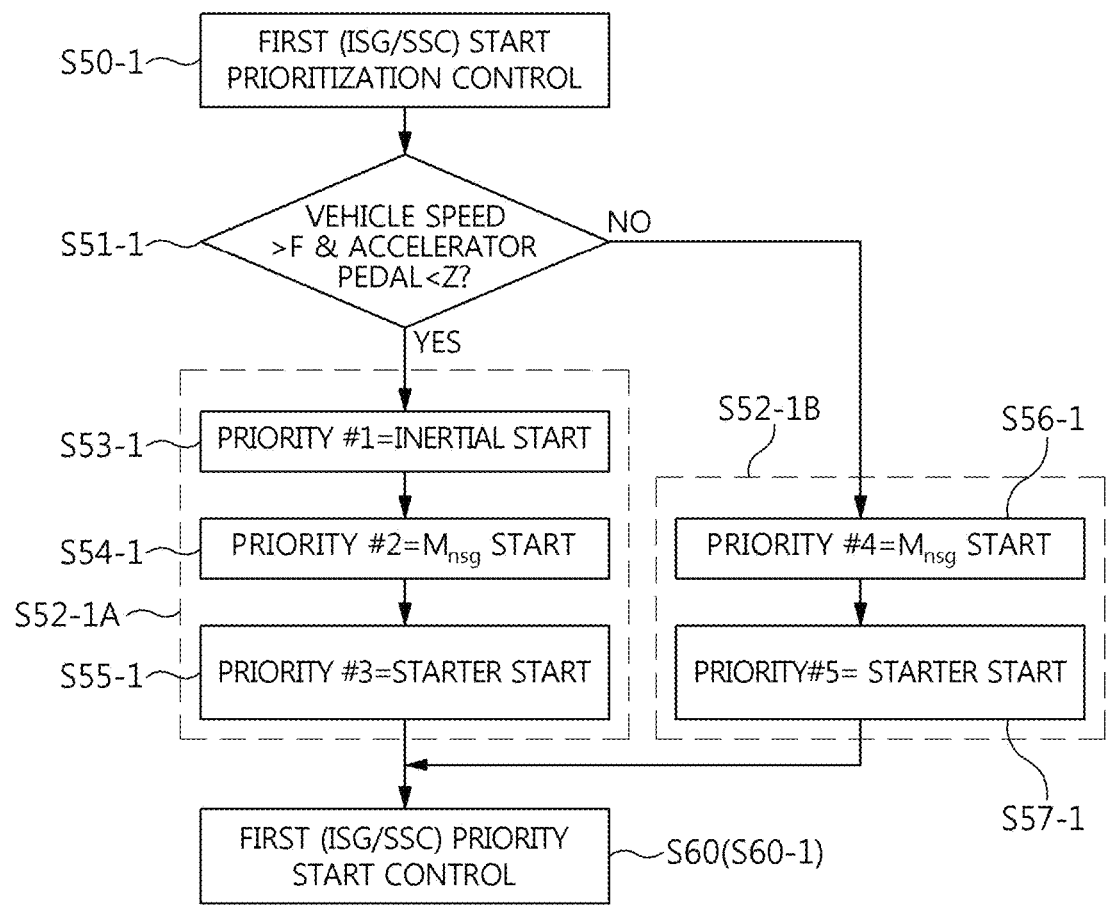
FIG. 9 is a detailed flowchart illustrating ISG/SSC start prioritization control according to the present disclosure.

Referring to FIG. 9, the start controller 10 performs the ISG/SSC start prioritization control S50-1 in a transmission use determination step S51-1, a first inertial start step S52-1A, and a second inertial start step S52-1B.

For example, the transmission use determination S51-1 uses the following coasting determination equation based on the road condition that enables coasting:

Coasting Determination Equation: vehicle speed>F
& APS<Z.

Here, "vehicle speed" is the coasting vehicle speed detection value in the coasting state of the vehicle 1, "F" is the coasting vehicle speed threshold and is usually determined as the maximum vehicle speed during the coasting, "APS" is the APS detection value based on the stroke of the accelerator pedal 7-1, "Z" is the APS threshold and is determined as the maximum APS which maintains the coasting state without changing it, and "<" is the inequality indicating the magnitude relationship between the two values.

As a result, the start controller 10 enters the first inertial start step S52-1A when both of "vehicle speed>F" and "APS<Z" are simultaneously satisfied, whereas it switches to the second inertial start step S52-1B when any of "vehicle speed>F" and "APS<Z" is not satisfied.

Specifically, the first inertial start S52-1A includes Priority #1=inertial start S53-1, Priority #2=MHSG start S54-1, and Priority #3=starter start S55-1. On the other hand, the second inertial start S52-1B includes Priority #4=MHSG start S56-1 and Priority #5=starter start S57-1.

In this case, the meaning of each of Priorities #1, #2, #3, #4, and #5 in the ISG/SSC start situation is as follows.

For example, the inertial start (Priority #1) means that whether it is possible in the transmission is determined to be transmitted to the CAN, there is no reverse rotation determination, and the vehicle speed and the accelerator pedal condition are satisfied. The MHSG start (Priority #2) means that the battery state and the MHSG state are checked in the inertial start enable state, and the motor torque threshold condition considering the battery SOC and the MHSG temperature together with the SOC threshold considering the start water temperature is satisfied. The starter start (Priority #3) means that a normal state is checked in which the starter 3 is not faulty in the inertial start enable state.

For example, the MHSG start (Priority #4) means that the battery state and the MHSG state are checked in the inertial start disable state, and the motor torque threshold condition considering the battery SOC and the MHSG temperature together with the SOC threshold considering the start water temperature is satisfied. The starter start (Priority #5) means that a normal state is checked in which the starter 3 is not faulty in the inertial start disable state.

The ISG/SCC priority start control S50-1 of the priority start control S50 is performed by prioritizing the inertial start enable state and the inertial start disable state.

In embodiments, in the inertial start enable state, Priority #1, which is a high priority, is applied to the inertial start, and Priorities #2 and #3, which are next priorities, are applied to the MHSG start and the starter start in this order. On the other hand, in the inertial start disable state, Priority #4, which is a high priority, is applied to the MHSG start, and Priority #5, which is a next priority, is applied to the starter start.

The start controller 10 performs the CoM start prioritization control S50-2.

Figure 10:
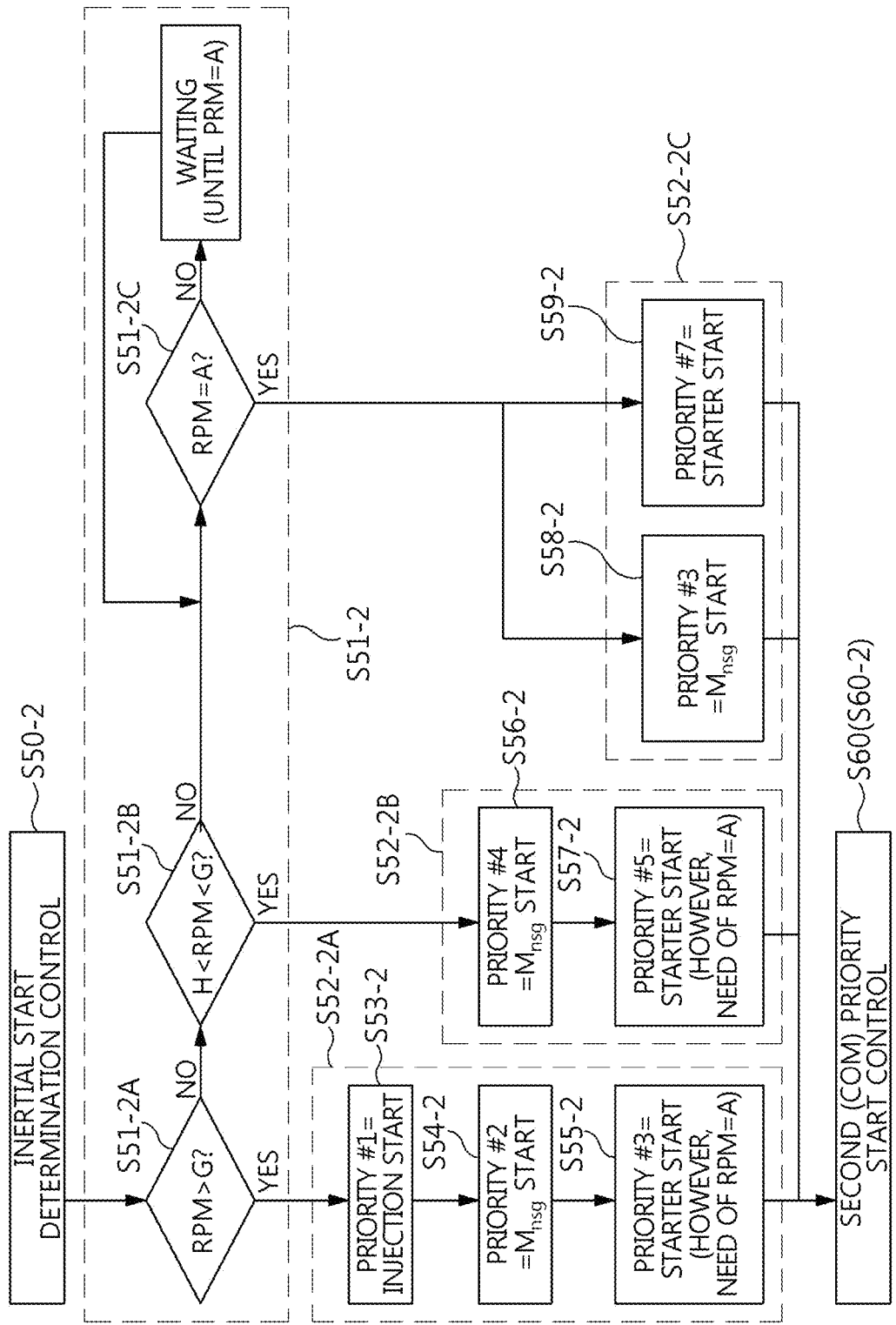
FIG. 10 is a detailed flowchart illustrating CoM start prioritization control according to the present disclosure.

Referring to FIG. 10, the start controller 10 performs the CoM start prioritization control S50-2 in a fuel injection use determination step S51-2, a first priority start step S52-2A, a second priority start step S52-2B, and a third priority start step S52-2C.

For example, the fuel injection use determination S51-2 includes a high idle determination step S51-2A, a low idle determination step S51-2B, and an engine stop determination step S51-2C, uses the following determination equations for them:

High Idle Determination Equation: RPM>G;

Low Idle Determination Equation: H<RPM<G; and

Engine Stop Determination Equation: RPM=A.

Here, "RPM" is the engine speed detection value, "G" is about 600 RPM or more as the high idle threshold that enables the injection start to be prioritized, "H" is about 200 RPM or more as the low idle threshold that enables the MHSG start to be prioritized in the injection start disable state, and "A" is 0 (zero) as the engine speed threshold that enables the MHSG start or the starter start in the engine stop state.

As a result, the start controller 10 enters the injection start priority step S52-2A when "RPM>G" is satisfied, enters the injection start second priority step S52-2B when "RPM>G" is not satisfied but "H<RPM<G" is satisfied, enters the injection start exclusion step S52-2C when "H<RPM<G" is not satisfied, and waits until RPM=0 is reached through "RPM=A".

Specifically, the first priority start S52-2A includes Priority #1=injection start S53-2, Priority #2=MHSG start S54-2, and Priority #3=starter start S55-2. In this case, "Priority #3=starter start" is applied after waiting until RPM=0 is reached.

Specifically, the second priority start S52-2B includes Priority #4=MHSG start S56-2 and Priority #5=starter start S57-2. In this case, "Priority #5=starter start" is applied after waiting until RPM=0 is reached.

Specifically, the third priority start S52-2C includes Priority #6=MHSG start S58-2 and Priority #7=starter start S59-2.

In this case, the meaning of each of Priorities #1, #2, #3, #4, #5, #6, and #7 in the CoM start situation is as follows.

For example, the injection start (Priority #1) means that the start is possible only by injection in the high rotation range in which the speed of the engine 2 is about 600 RPM or more. The MHSG start (Priority #2) means that the RPM threshold (i.e., high idle threshold) is satisfied in the high rotation range of about 600 RPM or more and the motor torque threshold condition considering the battery SOC and the MHSG temperature together with the SOC threshold considering the start water temperature is satisfied. The starter start (Priority #3) means that the RPM threshold (i.e., high idle threshold) is satisfied in the high rotation range of about 600 RPM or more and the start is possible by the MHSG.

For example, the MHSG start (Priority #4) means that the RPM threshold (i.e., low idle threshold) is satisfied in the middle rotation range of about 200 RPM and the motor torque threshold condition considering the battery SOC and the MHSG temperature together with the SOC threshold considering the start water temperature is satisfied. The starter start (Priority #5) means that the RPM threshold (i.e., high idle threshold) is satisfied in the middle rotation range of about 200 RPM and the start is possible by the MHSG.

For example, the MHSG start (Priority #6) means that the MHSG start is possible without waiting until "RPM=0" is reached since the MHSG start is in the middle rotation range of about 200 RPM and the motor torque threshold condition considering the battery SOC and the MHSG temperature together with the SOC threshold considering the start water temperature is satisfied. The starter start (Priority #7) means that the condition the "RPM=0" is reached is satisfied for the starter start since the starter start is in the middle rotation range of about 200 RPM.

The CoM start prioritization control S50-2 of the priority start attempt control S50 differently prioritizes the first priority start S52-2A, the second priority start S52-2B, and the third priority start S52-2C.

In embodiments, in the first priority start S52-2A, Priority #1, which is a high priority, is applied to the injection start, and Priorities #2 and #3, which are next priorities, are applied to the MHSG start and the starter start in this order. In the second priority start S52-2B, Priority #4, which is a high priority, is applied to the MHSG start, and Priority #5, which is a next priority, is applied to the starter start. In the third priority start S52-2C, Priority #6, which is a high priority, is applied to the MHSG start, and Priority #7, which is a next priority, is applied to the starter start.

Figure 11:
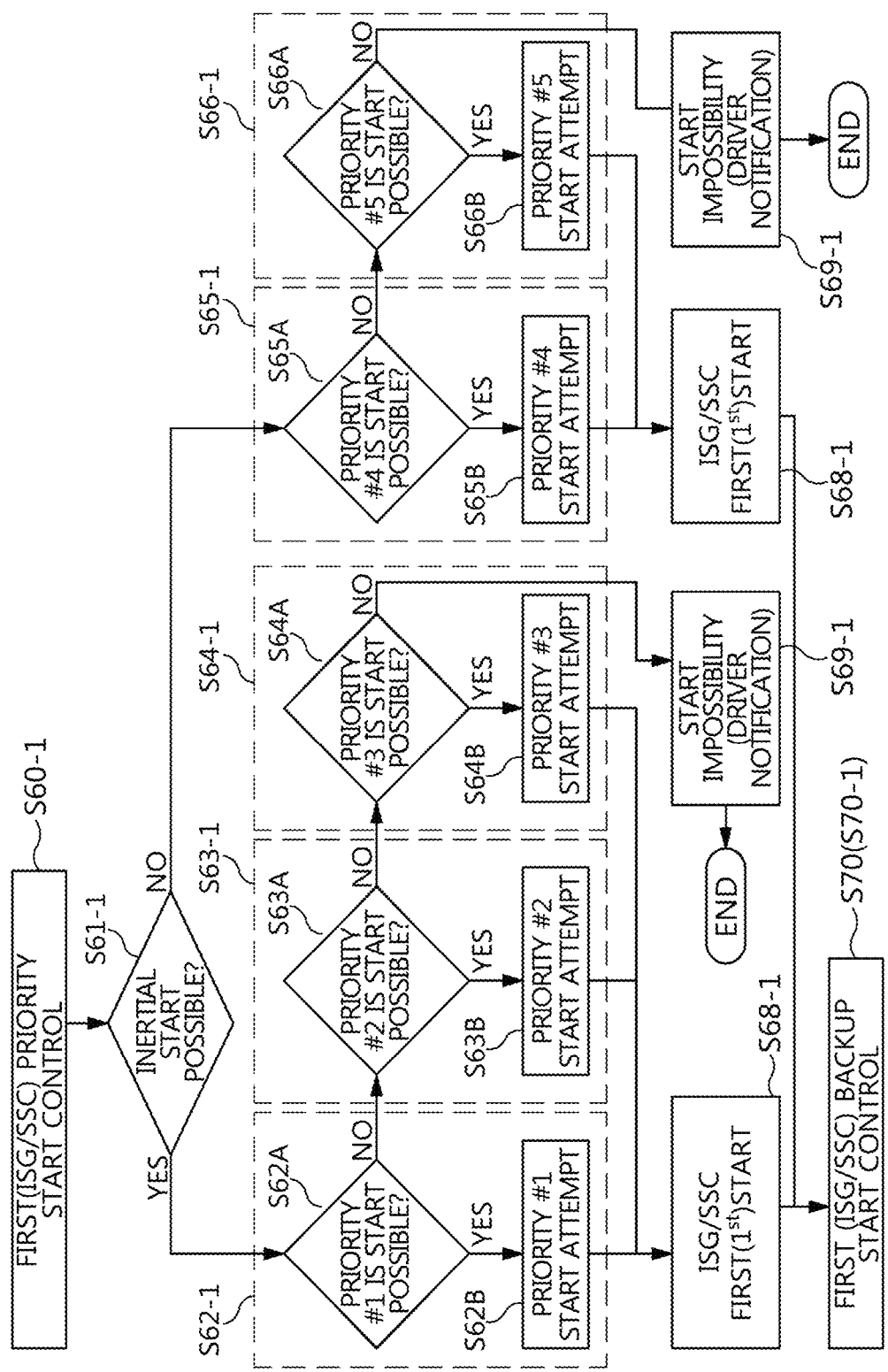
FIG. 11 is a detailed flowchart illustrating ISG/SSC priority start control according to the present disclosure.
Figure 12:
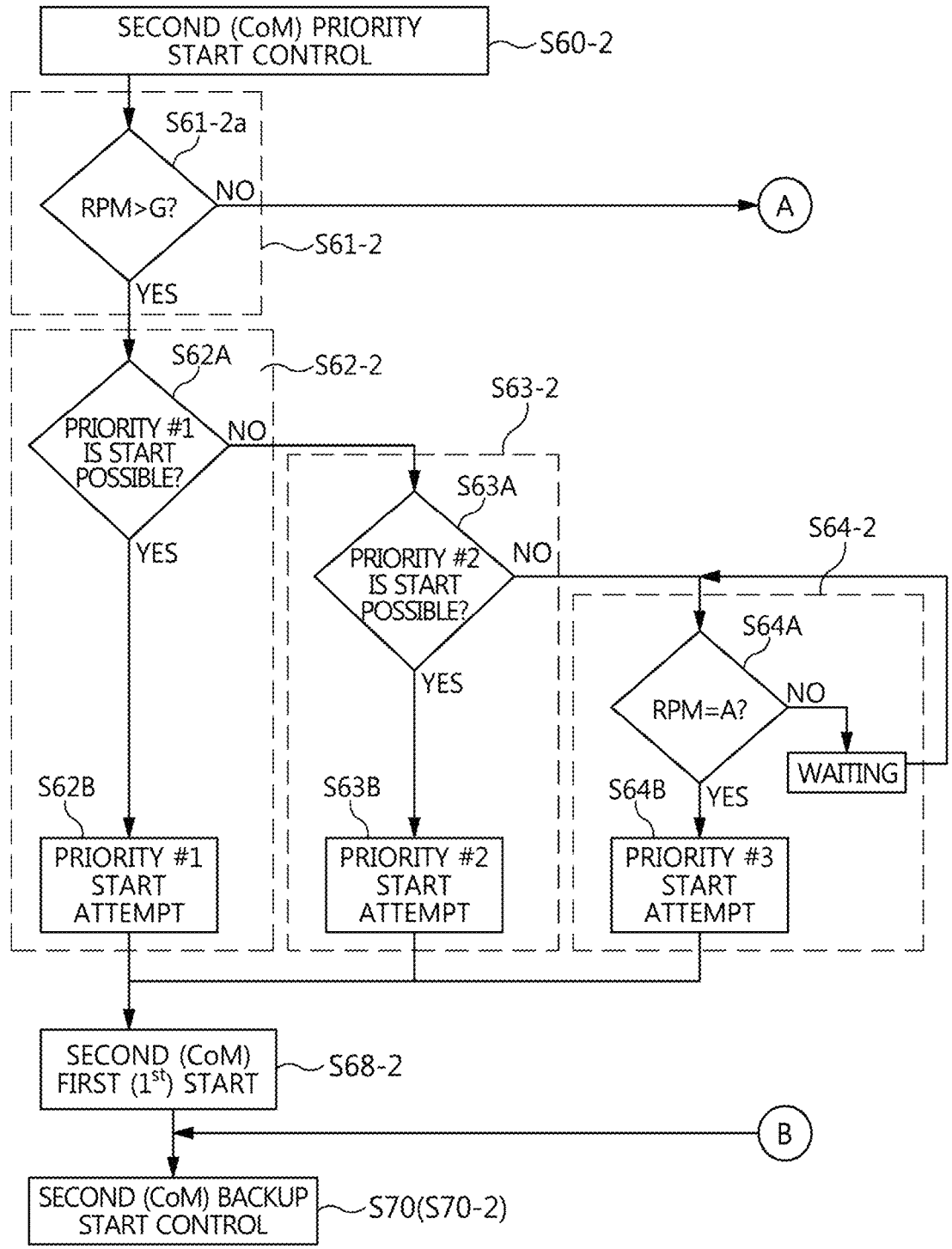
FIGS. 12 and 13 are detailed flowcharts illustrating CoM priority start control according to the present disclosure.
Figure 13:
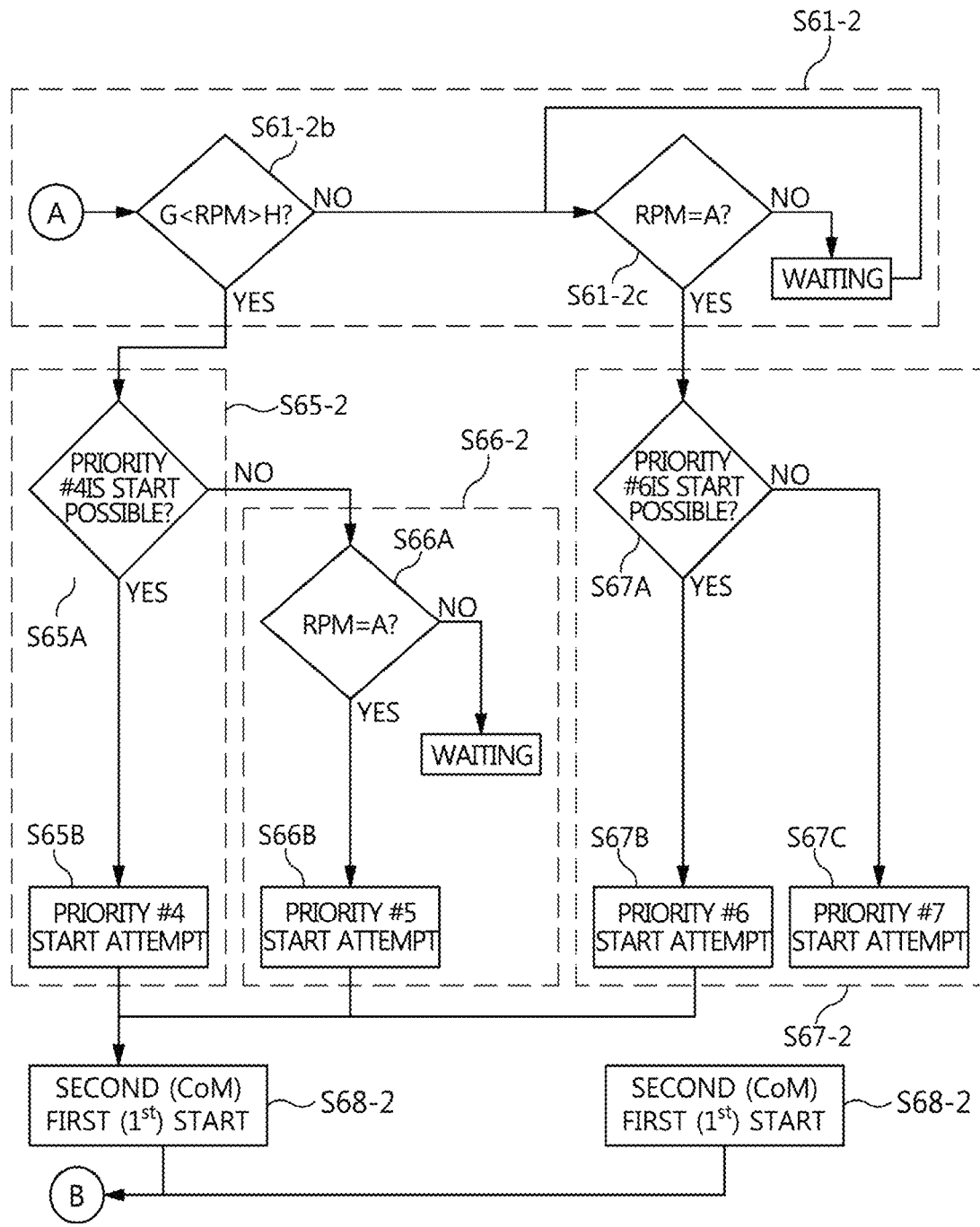

Next, the start controller 10 performs the priority start attempt control S60 including ISG/SSC priority start attempt control S60-1 of FIG. 11 and CoM priority start attempt control S60-2 of FIGS. 12 and 13.

Referring to FIG. 11, the start controller 10 performs the ISG/SSC priority start attempt control S60-1 in an inertial start determination step S61-1, a first inertial start step S62-1 to S64-1, and a second inertial start step S65-1 to S66-1.

For example, the inertial start determination S61-1 is performed using "vehicle speed>F" and "APS<Z" which are used for the transmission use determination S51-1 applied to the ISG/SSC start prioritization control S50-1 of FIG. 9. As a result, the inertial start determination S61-1 includes the first inertial start S62-1 to S64-1 that is prioritized in the inertial start enable state and the second inertial start S65-1 to S66-1 that is prioritized in the inertial start disable state.

For example, the first inertial start S62-1 includes an SSC selection step S62-1, an ISG motor selection step S63-1, and an ISG starter selection step S64-1, and sets the SSC selection as a first priority so that the ISG motor selection is performed when the SSC selection is impossible and the ISG starter selection is then performed when the ISG motor selection is impossible.

Specifically, the SSC selection S62-1 is performed in an inertial start selection step as Priority #1 S62A and an inertial start attempt step S62B. The ISG motor selection S63-1 is performed in an MHSG start selection step as Priority #2 S63A and an MHSG start attempt step S63B. The ISG starter selection S64-1 is performed in a starter start selection step as Priority #3 S64A and a starter start attempt step S64B.

For example, the second inertial start S62-1 includes an ISG motor selection step S65-1 and an ISG starter selection step S66-1, and sets the ISG motor selection as a first priority so that the ISG starter selection is performed when the ISG motor selection is impossible.

Specifically, the ISG motor selection S65-1 is performed in an MHSG start selection step as Priority #4 S65A and an MHSG start attempt step S65B. The ISG starter selection S66-1 is performed in a starter start selection step as Priority #5 S66A and a starter start attempt step S66B.

The start controller 10 switches to an ISG/SSC first start completion step S68-1 or an ISG/SSC start impossibility step S69-1.

For example, the ISG/SSC start impossibility S69-1 is checked when the starter start (Priority #3) is impossible (S64-1) in the first inertial start S62-1 to S64-1 or when the starter start (Priority #5) is impossible (S66-1) in the second inertial start S65-1 to S66-1. Therefore, in the ISG/SSC start impossibility S69-1, the start controller 10 notifies the driver that the vehicle 1 cannot be restarted by displaying a message or lighting of "no start" in the cluster or dashboard of the driver's seat.

For example, the ISG/SSC first start completion S68-1 refers to a state in which the restart is performed by setting each of the inertial start (Priority #1) S62-1, the MHSG start (Priority #2) S63-1, the starter start (Priority #3) S64-1, the MHSG start (Priority #4) S65-1, and the starter start (Priority #5) S66-1 as a high priority. Therefore, the start controller 10 enters backup start determination control S70 after the ISG/SSC first start completion S68-1.

Referring to FIGS. 12 and 13, the start controller 10 performs the CoM priority start attempt control S60-2 in an inertial start determination step S61-2, a first start priority step S62-2 to S64-2, a second start priority step S65-2 to S66-2, and a third start priority step S67-2.

For example, the inertial start determination S61-2 is performed using "RPM>G", "H<RPM<G", and "RPM=0" which are used for the fuel injection use determination S51-2 applied to the CoM start prioritization control S50-2 of FIG. 10. As a result, the inertial start determination S61-2 includes the first start priority S62-2 to S64-2 that is prioritized in "RPM>G" of the high idle determination S61-2A, the second start priority S65-2 to S66-2 that is prioritized in "H<RPM<G" of the low idle determination S61-2B, and the third start priority step S67-2 that is prioritized in the engine stop (i.e., RPM=0) based on "RPM=A" of the engine stop determination S61-2C.

For example, the first start priority S62-2 to S64-2 includes an SSC selection step S62-2, an ISG motor selection step S63-2, and an ISG starter selection step S64-2, and sets the SSC selection as a first priority so that the ISG motor selection is performed when the SSC selection is impossible and the ISG starter selection is then performed when the ISG motor selection is impossible.

Specifically, the SSC selection S62-2 is performed in an injection start selection step as Priority #1 S62A and an injection start attempt step S62B. The ISG motor selection S63-2 is performed in an MHSG start selection step as Priority #2 S63A and an MHSG start attempt step S63B. The ISG starter selection S64-2 is performed in a starter start selection step as Priority #3 after engine stop (i.e., RPM=0) S64A and a starter start attempt step S64B.

For example, the second start priority S65-2 to S66-2 includes an ISG motor selection step S65-2 and an ISG starter selection step S66-2, and sets the ISG motor selection as a first priority so that the ISG starter selection is performed when the ISG motor selection is impossible.

Specifically, the ISG motor selection S65-2 is performed in an MHSG start selection step as Priority #4 S65A and an MHSG start attempt step S65B. The ISG starter selection S66-2 is performed in a starter start selection step as Priority #5 after engine stop (i.e., RPM=0) S66A.

For example, the third start priority S67-2 is performed in an MHSG start application determination step as Priority #6 S67A, an MHSG start selection step as Priority #6 S67B, and a starter start selection step as Priority #7 S67C.

The start controller 10 switches to a CoM first start completion step S68-2.

For example, the CoM first start completion S68-2 refers to a state in which the restart is performed by setting each of the injection start (Priority #1) S62-2, the MHSG start (Priority #2) S63-2, the starter start (Priority #3) S64-2, the MHSG start (Priority #4) S65-2, and the starter start (Priority #5) S66-2, and the MHSG start (Priority #6) or the starter start (Priority #7) S67-2 as a high priority. Therefore, the start controller 10 enters backup start determination control S70 after the ISG/SSC first start completion S68-1.

Figure 14:
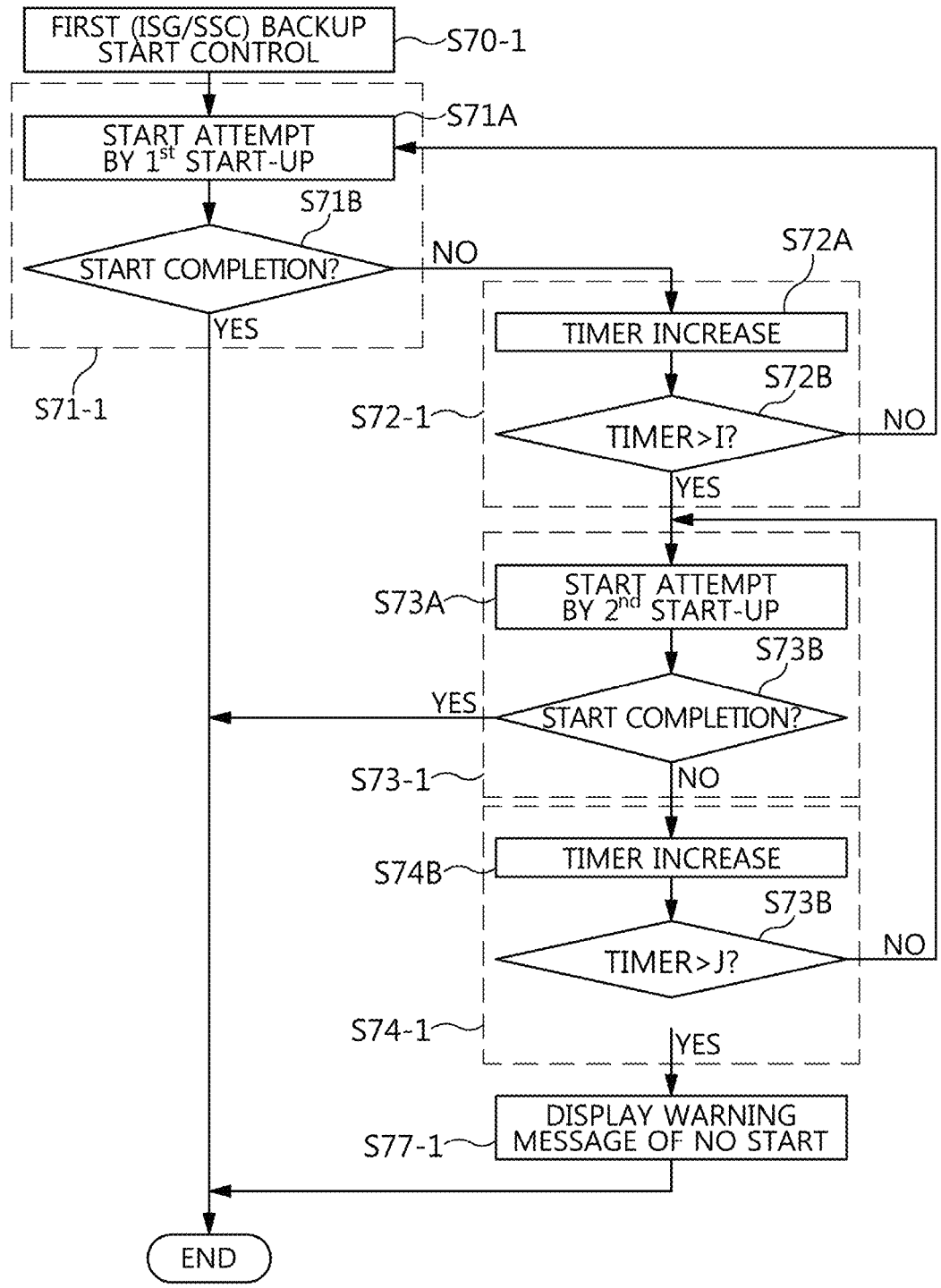
FIG. 14 is a detailed flowchart illustrating ISG/SSC backup start control according to the present disclosure.
Figure 15:
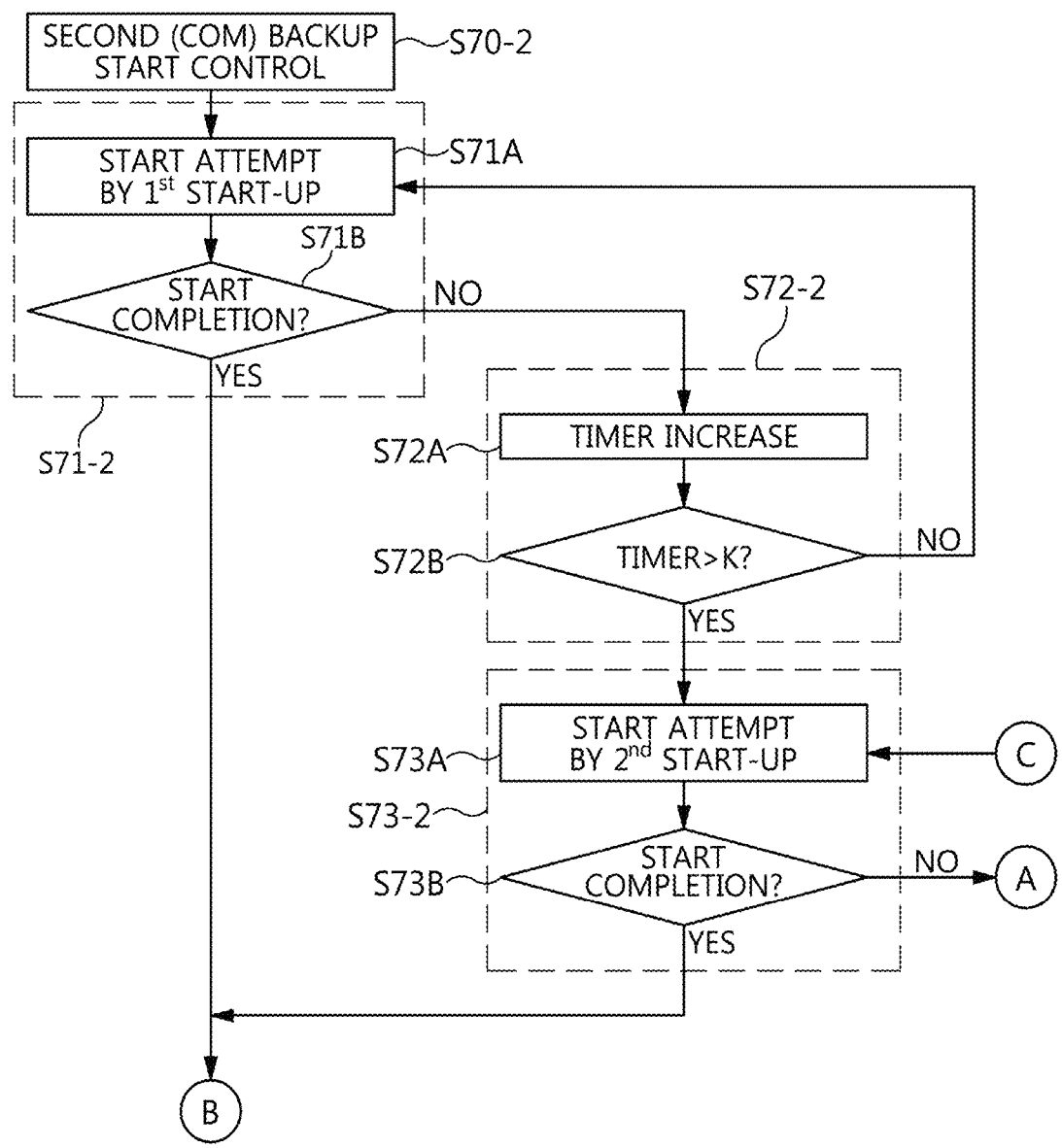
FIGS. 15 and 16 are detailed flowcharts illustrating CoM backup start control according to the present disclosure.
Figure 16:
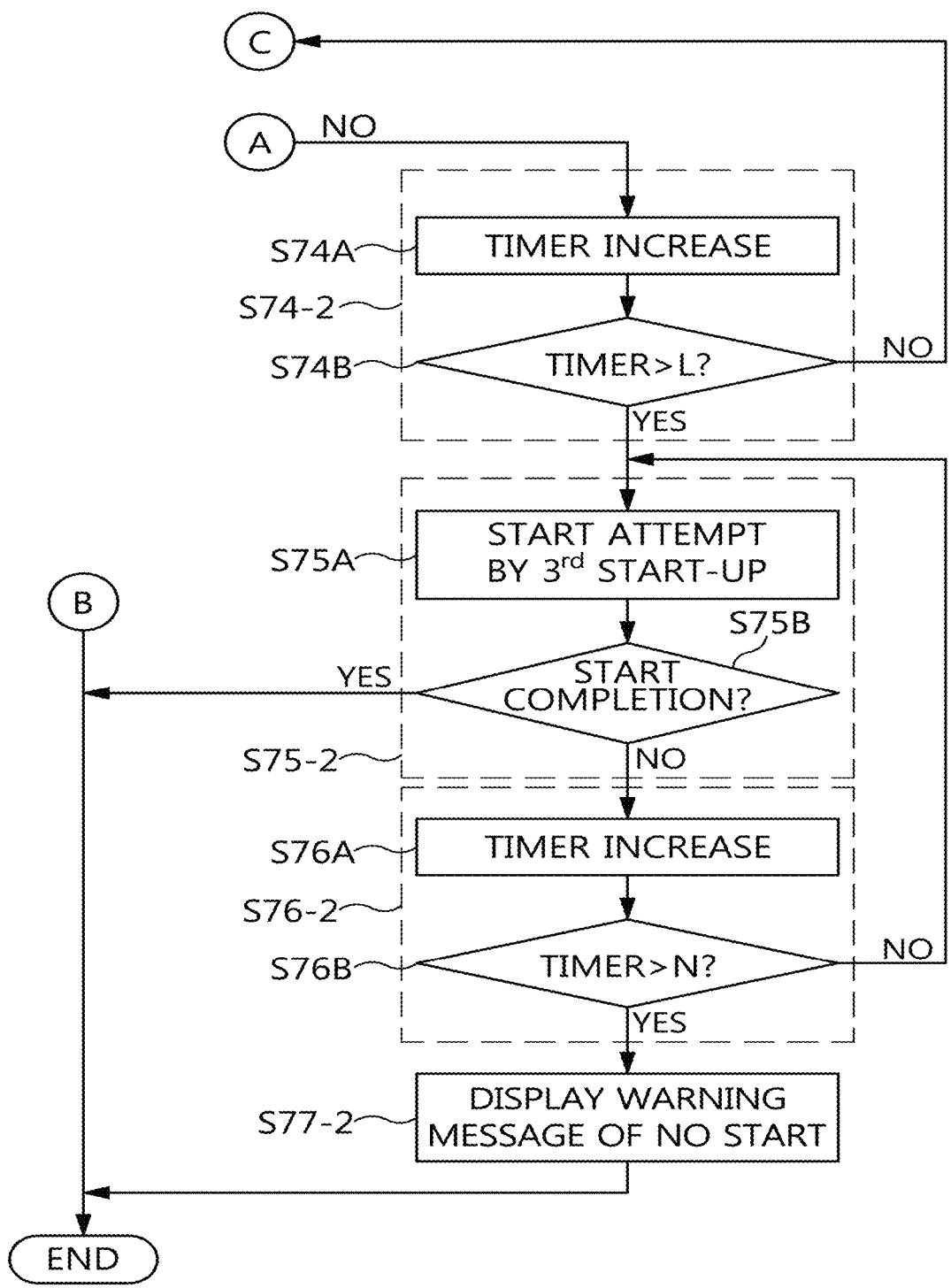

Next, the start controller 10 performs the backup start determination control S70 including first (ISG/SSC) backup start control S70-1 of FIG. 14 and second (CoM) backup start control S70-2 of FIGS. 15 and 16.

Referring to FIG. 14, the start controller 10 performs the first (ISG/SSC) backup start control S70-1 in an ISG/SCC high priority start determination step S71-1, a first priority start success check step S72-1, an ISG/SCC next priority start determination step S73-1, a second priority start success check step S74-1, and an ISG/SCC start impossibility switching step S77-1.

For example, the ISG/SCC high priority start determination S71-1 includes a first start attempt check step S71A and a start completion check step S71B. In this case, the first start attempt check S71A is one of the inertial start (Priority #1) that imparts the high priority to the ISG/SCC priority start attempt control S60-1 of FIG. 11, the MHSG start (Priority #2), the starter start (Priority #3), the MHSG start (Priority #4), and the starter start (Priority #5). The start completion check S71B is the same as the ISG/SCC first start completion S68-1 which is a high priority based on the ISG/SCC priority start attempt control S60-1 of FIG. 11.

Therefore, the start controller 10 stops the backup start and completes the restart control when the RPM of the engine 2 rises as a result of the ISG/SSC first start completion S68-1 in the ISG/SSC high priority start determination S71-1. On the other hand, the start controller 10 enters the first priority start success check S72-1 when the RPM does not rise.

For example, the first priority start success check S72-1 is performed in a timer count step S72A and a redetermination timeout step S72B. In this case, the timer count S72A is accumulated in units of seconds. The redetermination timeout S72B uses the following timer allowable equation for the redetermination number of times margin:

Timer Allowable Equation: Timer>I.

Here, "timer" is the timer count number of times, and "I" is set to about several seconds as the timer count number of times threshold.

As a result, the start controller 10 maintains the backup start in the ISG/SCC high priority start determination S73-1 when the RPM of the engine 2 does not rise as a result the ISG/SCC first start completion S68-1 even though the ISG/SCC high priority start determination S71-1 is repeatedly performed within the timer count number of times threshold.

For example, the ISG/SCC next priority start determination S73-1 is performed in a second start attempt check step S73A and a start completion check step S73B. In this case, the second start attempt check S73A is one of the inertial start (Priority #1) that imparts the next priority to the ISG/SCC priority start attempt control S60-1 of FIG. 11, the MHSG start (Priority #2), the starter start (Priority #3), the MHSG start (Priority #4), and the starter start (Priority #5). The start completion check S73B is the same as the ISG/SCC first start completion S68-1 which is a next priority based on the ISG/SCC priority start attempt control S60-1 of FIG. 11.

Therefore, the start controller 10 stops the backup start and completes the restart control when the RPM of the engine 2 rises as a result of the ISG/SSC first start completion S68-1 in the ISG/SSC next priority start determination S73-1. On the other hand, the start controller 10 enters the second priority start success check S74-1 when the RPM does not rise.

For example, the second priority start success check S74-1 is performed in a timer count step S74A and a redetermination timeout step S74B. In this case, the timer count S74A is accumulated in units of seconds. The redetermination timeout S74B uses the following timer allowable equation for the redetermination number of times margin:

$$\text{Timer Allowable Equation: Timer} > J.$$

Here, "timer" is the timer count number of times, and "J" is set to about several seconds as the timer count number of times threshold. Particularly, "J" may be set to the same value as or a different value from "I".

As a result, the start controller 10 switches to the ISG/SCC start impossibility S77-1 and then stops the backup start when the RPM of the engine 2 does not rise as a result the ISG/SCC first start completion S68-1 even though the ISG/SCC next priority start determination S73-1 is repeatedly performed within the timer count number of times threshold.

For example, since the ISG/SSC start impossibility S77-1 is the same as the ISG/SSC start impossibility S69-1 of FIG. 11 in which the start controller 10 displays a message or lighting of "no start" in the cluster or dashboard of the driver's seat, the driver is notified that the vehicle 1 cannot be restarted.

The start controller 10 performs the ISG/SCC backup start determination control S70-1 by the second start attempt in which one of the inertial start (Priority #1), the MHSG start (Priority #2), the starter start (Priority #3), the MHSG start (Priority #4), and the starter start (Priority #5) is a high priority or a next priority.

Referring to FIGS. 15 and 16, the start controller 10 performs the second (CoM) backup start control S70-2 in a CoM high priority start determination step S71-2, a first priority start success check step S72-2, a CoM next priority start determination step S73-2, a second priority start success check step S74-2, a CoM low priority start determination step S75-2, a third priority start success check step S76-2, and an ISG/SCC start impossibility switching step S77-2.

For example, the CoM high priority start determination S71-2 includes a first start attempt check step S71A and a start completion check step S71B. In this case, the first start attempt check S71A is one of the injection start (Priority #1) that imparts the high priority to the CoM priority start attempt control S60-2 of FIG. 12, the MHSG start (Priority #2), the starter start (Priority #3), the MHSG start (Priority #4), the starter start (Priority #5), the MHSG start (Priority #6), and the starter start (Priority #7). The start completion check S71B is the same as the CoM first start completion S68-2 which is a high priority based on the CoM priority start attempt control S60-2 of FIG. 12.

Therefore, the start controller 10 stops the backup start and completes the restart control when the RPM of the engine 2 rises as a result of the CoM first start completion S68-2 in the CoM high priority start determination S71-2. On the other hand, the start controller 10 enters the first priority start success check S72-2 when the RPM does not rise.

For example, the first priority start success check S72-1 is performed in a timer count step S72A and a redetermination timeout step S72B. In this case, the timer count S72A is accumulated in units of seconds. The redetermination timeout S72B uses the following timer allowable equation for the redetermination number of times margin:

$$\text{Timer Allowable Equation: Timer} > K.$$

Here, "timer" is the timer count number of times, and "K" is set to about several seconds as the timer count number of times threshold.

As a result, the start controller 10 maintains the backup start in the CoM high priority start determination S73-2 when the RPM of the engine 2 does not rise as a result the CoM first start completion S68-2 even though the CoM high priority start determination S71-2 is repeatedly performed within the timer count number of times threshold.

For example, the CoM next priority start determination S73-2 is performed in a second start attempt check step S73A and a start completion check step S73B. In this case, the second start attempt check S73A is one of the injection start (Priority #1) that imparts the next priority to the CoM priority start attempt control S60-2 of FIG. 12, the MHSG start (Priority #2), the starter start (Priority #3), the MHSG start (Priority #4), the starter start (Priority #5), the MHSG start (Priority #6), and the starter start (Priority #7). The start completion check S73B is the same as the CoM first start completion S68-2 which is a next priority based on the CoM priority start attempt control S60-2 of FIG. 12.

Therefore, the start controller 10 stops the backup start and completes the restart control when the RPM of the engine 2 rises as a result of the CoM first start completion S68-2 in the CoM next priority start determination S73-2. On the other hand, the start controller 10 enters the second priority start success check S74-2 when the RPM does not rise.

For example, the second priority start success check S74-2 is performed in a backup timer count step S74A and a redetermination timeout step S74B. In this case, the timer count S74A is accumulated in units of seconds. The redetermination timeout S74B uses the following backup timer allowable equation for the redetermination number of times margin:

$$\text{Backup Timer Allowable Equation: Backup Timer} > L.$$

Here, "backup timer" is the backup timer count number of times, and "L" is set to about several seconds as the backup timer count number of times threshold. Particularly, "L" may be set to the same value as or a different value from "K".

As a result, the start controller 10 switches to the ISG/SCC start impossibility S77-1 and then stops the backup start when the RPM of the engine 2 does not rise as a result the CoM first start completion S68-1 even though the CoM next priority start determination S73-2 is repeatedly performed within the backup timer count number of times threshold.

For example, the CoM low priority start determination S75-2 is performed in a third start attempt check step S75A and a start completion check step S75B. In this case, the third start attempt check S75A is one of the injection start (Priority #1) that imparts the low priority to the CoM priority start attempt control S60-2 of FIG. 12, the MHSG start (Priority #2), the starter start (Priority #3), the MHSG start (Priority #4), the starter start (Priority #5), the MHSG start (Priority #6), and the starter start (Priority #7). The start completion check S75B is the same as the CoM first start completion S68-2 which is a low priority based on the CoM priority start attempt control S60-2 of FIG. 12.

Therefore, the start controller 10 stops the backup start and completes the restart control when the RPM of the engine 2 rises as a result of the CoM first start completion S68-2 in the CoM low priority start determination S75-2. On the other hand, the start controller 10 enters the third priority start success check S76-2 when the RPM does not rise.

For example, the third priority start success check S76-2 is performed in a final backup timer count step S76A and a redetermination timeout step S76B. In this case, the final backup timer count S76A is accumulated in units of seconds. The redetermination timeout S76B uses the following final backup timer allowable equation for the redetermination number of times margin:

Final Backup Timer Allowable Equation: Final Backup Timer>M.

Here, "final backup timer" is the final backup timer count number of times, and "M" is set to about several seconds as the final backup timer count number of times threshold. Particularly, "M" may be set to the same value as or a different value from "L" and/or "K".

As a result, the start controller 10 switches to the CoM start impossibility S77-2 and then stops the backup start when the RPM of the engine 2 does not rise as a result the CoM first start completion S68-2 even though the CoM low priority start determination S75-1 is repeatedly performed within the final backup timer count number of times threshold.

For example, in the CoM start impossibility S77-2, the start controller 10 notifies the driver that the vehicle 1 cannot be restarted by displaying a message or lighting of "no start" in the cluster or dashboard of the driver's seat. Particularly, the CoM start impossibility S77-2 may be CoM start impossibility in the CoM priority start control S60-2 of FIG. 12.

The start controller 10 performs the CoM backup start determination control S70-2 by the second start attempt in which one of the injection start (Priority #1), the MHSG start (Priority #2), the starter start (Priority #3), the MHSG start (Priority #4), the starter start (Priority #5), the MHSG start (Priority #6), and the starter start (Priority #7) is a high priority or a next priority.

As described above, the engine restart control method of the vehicle according to the present embodiment can improve fuel efficiency and merchantable quality by ensuring the safety of the ISG start and the SSC start in such a way to perform the ISG/SSC start control, in which the inertial start is set as a high priority and the starter start and the MHSG start are set as next priorities with the possibility of the transmission inertial start for the restart attempt of the start controller 10, and the CoM start control in which the injection start is set as a high priority and the MHSG start and the starter start are set as a next priority and a low priority in the engine speed detection range. In addition, the engine restart control method can significantly reduce the start failure situation by prioritizing the inertial start, the MHSG start, the starter start, and the injection start to complement the initial start failure with the backup start.

As is apparent from the above description, the method of controlling engine restart applied to the vehicle according to the present disclosure has the following operations and effects by prioritizing various start-ups.

First, it is possible to optimize the start control logic since the 48V vehicle uses the most appropriate start-up of various start-ups compared to the start logic. Second, it is possible to further enhancing fuel efficiency by reducing an amount of fuel with the MHSG start capable of avoiding a delay of fuel injection point compared to using the starter during the backup start for the ISG and SSC starts and of avoiding an excessive injection amount of fuel consumed in the general start. Third, it is possible to improve power performance, which is a cause of consumer complaints, by immediately performing the restart with the backup start for the ISG and SSC starts in the change of mind (CoM) situation. Fourth, it is possible to protect the start-related parts including the starter while reducing a possibility of restart failure through the backup start function. Fifth, it is possible to significantly enhance merchantable quality by implementing the optimal start control logic by the 48V vehicle using various start-ups such as the key start, the starter start, the MHSG start, the ISG start, the SSC start, the inertial start, and the injection start, compared to the general vehicle using only the key start and the ISG start.

Logical blocks, modules or units described in connection with embodiments disclosed herein can be implemented or performed by a computing device having at least one processor, at least one memory and at least one communication interface. The elements of a method, process, or algorithm described in connection with embodiments disclosed herein can be embodied directly in hardware, in a software module executed by at least one processor, or in a combination of the two. Computer-executable instructions for implementing a method, process, or algorithm described in connection with embodiments disclosed herein can be stored in a non-transitory computer readable storage medium.

While embodiments of the present disclosure have been described, it will be apparent to those skilled in the art that various changes and modifications may be made without departing from the spirit and scope of the disclosure as defined in the following claims.

What is claimed is:

1. A method of controlling engine restart, the method comprising:
   selecting, by a start controller, a first start situation and a second start situation for restarting an engine of a vehicle;
   determining, among possible start-ups, current possible start-ups for each of the first and second start situations;
   prioritizing the current possible start-ups for each of the first and second start situations; and
   attempting to restart the engine by setting the first and second start situations as first start control and second start control, respectively, based on priorities of the start-ups,
   wherein the first start control sequentially performs start-up check, start-up determination, start prioritization, and priority start attempt for each of an inertial start, a starter start, and a mild hybrid starter & generator (MHSG) start.

2. The method of claim 1,
   wherein the possible start-ups comprise an inertial start, the MHSG start, the starter start, and an injection start, wherein the inertial start, the starter start, and the MHSG start are applied to the first start control, and wherein the injection start, the starter start, and the MHSG start are applied to the second start control.

3. The method of claim 1, wherein the first start control and the second start control are selected by start situation determination control, and the start situation determination control comprises a first restart situation for the first start control and a second restart situation for the second start control by an engine speed when there is no key start request.

4. The method of claim 3, wherein the engine speed is a revolution per minute (RPM) of the engine, and the first and second restart situations are determined by setting the RPM to 0 (zero).

5. The method of claim 1, wherein the inertial start applies detection of a transmission bit signal and non-detection of an engine reverse rotation signal to the start-up determination, the MHSG start applies detection of a dischargeable battery state of charge (SOC) to the start-up determination, the starter start applies detection of operation of a starter relay to the start-up determination and the battery SOC is larger than an SOC threshold.

6. The method of claim 1, wherein the MHSG start applies detection of motor-drivable MHSG available torque to the start-up determination, and the MHSG available torque is larger than an available torque threshold.

7. The method of claim 1, wherein:
the prioritization applies one of a first inertial start having a high priority and a second inertial start having a next priority for the inertial start to the priority start attempt; and
the first inertial start makes it a condition that a vehicle speed is larger than a vehicle speed threshold and an accelerator pedal scope (APS) is smaller than an APS threshold, and the second inertial start makes it a condition that the vehicle speed is smaller than the vehicle speed threshold and the APS is larger than the APS threshold.

8. The method of claim 7, wherein:
the first inertial start performs the priority start attempt in the order of Priority #1=inertial start, Priority #2=MHSG start, and Priority #3=starter start, and then performs first backup start determination; and
the second inertial start performs the priority start attempt in the order of Priority #4=MHSG start and Priority #5=starter start, and then performs the first backup start determination.

9. The method of claim 8, wherein in the first backup start determination, a start success is checked as a timer setting value for a start failure of a first priority start priority of start priorities applied to the first or second inertial start, a backup start for start success is set as a second priority start priority of the start priorities applied to the first or second inertial start when the timer setting value is exceeded, and the start attempt is stopped when the backup start fails.

10. The method of claim 1, wherein the second start control sequentially performs start-up check, start-up determination, start prioritization, and priority start attempt for each of the MHSG start, the starter start, and an injection start.

11. The method of claim 10,
wherein the start-up determination includes the MHSG start applying a condition of a dischargeable battery state of charge (SOC), the starter start applying a condition of operation of a starter relay, the injection start applying a condition of an engine revolution per minute (RPM) range, and wherein the dischargeable battery SOC is larger than an SOC threshold, and the RPM range is larger than an RPM threshold.

12. The method of claim 10, wherein the MHSG start applies detection of motor-drivable MHSG available torque to the start-up determination, and the MHSG available torque is larger than an available torque threshold.

13. The method of claim 10, wherein:
the prioritization sets an RPM range as a high idle, a low idle, and an engine stop to apply one of a first start priority, a second start priority, and a third start priority to the priority start attempt; and
the first, second, and third start priorities are conditioned on the high idle, the low idle, and the engine stop, respectively.

14. The method of claim 13, wherein:
the first start priority performs the priority start attempt in the order of Priority #1=injection start, Priority #2=MHSG start, and Priority #3=starter start, and then performs second backup start determination;
the second start priority performs the priority start attempt in the order of Priority #4=MHSG start and Priority #5=starter start, and then performs the second backup start determination; and
the third start priority performs the priority start attempt in the order of Priority #6=MHSG start and Priority #7=starter start, and then performs the second backup start determination.

15. The method of claim 14, wherein in the second backup start determination, a start success is checked as a timer setting value for a start failure of a first priority start priority of start priorities applied to the first, second, or third start priority, a backup start for start success is set as a second priority start priority of the start priorities applied to the first, second, or third start priority when the timer setting value is exceeded, a start success is checked as a backup timer setting value for a start failure of the backup start, a final backup start is set as a third priority start priority of the start priorities applied to the first, second, or third start priority when the backup timer setting value is exceeded, a start success is checked as a final backup timer setting value for a start failure of the final backup start, and the start attempt is stopped when the final backup start fails.

16. A vehicle comprising:
a start controller of claim 1 configured to control engine restart; and
a 48V MHSG system comprising a starter to restart an engine having an injector for injection of fuel, and a mild hybrid starter & generator (MHSG),
wherein the start controller configured to perform idle stop and go/start and stop coasting (ISG/SSC) start control, in which an inertial start is set as a highest priority and a starter start and an MHSG start are set as next priorities with a possibility of transmission inertial start for restart attempt, and change of mind (CoM) start control, in which an injection start is set as the highest priority and the MHSG start and the starter start are set as a next priority and a lowest priority in an engine speed detection range, and to complement a restart failure of the ISG/SSC start control or the CoM start control with backup start control.

17. The vehicle of claim 16, wherein the start controller is connected to an engine electronic control unit (ECU) for controlling the engine, a motor control unit (MCU) for controlling the MHSG, a transmission control unit (TCU) for controlling a transmission, and a battery management system (BMS) for controlling a battery, through a controller area network (CAN) for communication therebetween.

* * * * *